US010565918B2

(12) United States Patent
Wu et al.

(10) Patent No.: US 10,565,918 B2
(45) Date of Patent: Feb. 18, 2020

(54) OLED PIXEL ARRANGEMENT STRUCTURE HAVING PIXEL UNIT OF FOUR SUB-PIXELS CONFIGURED FOR IMPROVING DISPLAY RESOLUTION

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Yuan Wu, Beijing (CN); Luxia Jiang, Beijing (CN); Hongwei Dai, Beijing (CN)

(73) Assignees: BOE TECHNOLOGY GROUP CO., LTD., Beijing (CN); HENGDU BOE OPTOELECTRONICS TECHNOLOGY CO., LTD., Sichuan (CN)

(*) Notice: Subject to any disclaimer, the term of this patent is extended or adjusted under 35 U.S.C. 154(b) by 105 days.

(21) Appl. No.: 15/557,721

(22) PCT Filed: Feb. 16, 2017

(86) PCT No.: PCT/CN2017/073790
§ 371 (c)(1),
(2) Date: Sep. 12, 2017

(87) PCT Pub. No.: WO2018/018878
PCT Pub. Date: Feb. 1, 2018

(65) Prior Publication Data
US 2018/0308412 A1    Oct. 25, 2018

(30) Foreign Application Priority Data
Jul. 26, 2016   (CN) .......................... 2016 1 0596086

(51) Int. Cl.
*G09G 3/20*       (2006.01)
*G09G 3/3258*     (2016.01)
(Continued)

(52) U.S. Cl.
CPC ......... *G09G 3/2003* (2013.01); *G09G 3/3258* (2013.01); *H01L 27/124* (2013.01);
(Continued)

(58) Field of Classification Search
CPC .......... G09G 3/2003; G09G 3/30; G09G 3/32; G09G 3/3208; G09G 3/3216;
(Continued)

(56) References Cited

U.S. PATENT DOCUMENTS

2005/0212728 A1* 9/2005 Miller .................. G09G 3/2003
345/76
2005/0265024 A1* 12/2005 Luk ......................... F21S 10/02
362/231
(Continued)

FOREIGN PATENT DOCUMENTS

CN    103887323 A    6/2014
CN    104282230 A    1/2015
(Continued)

OTHER PUBLICATIONS

The First Chinese Office Action dated Feb. 12, 2018; Appln. No. 201610596086.8.
(Continued)

*Primary Examiner* — Amit Chatly
*Assistant Examiner* — Nelson Lam
(74) *Attorney, Agent, or Firm* — Ladas & Parry LLP; Hermine Valizadeh

(57) ABSTRACT

A pixel arrangement structure and a display panel. The pixel arrangement structure includes a first pixel unit including a first sub-pixel, a second sub-pixel, a third sub-pixel and a fourth sub-pixel; a center of the first sub-pixel is coincident with a first vertex of a first virtual diamond; a center of the second sub-pixel is coincident with a second vertex of the first virtual diamond; a center of the third sub-pixel is
(Continued)

coincident with a third vertex of the first virtual diamond; and a center of the fourth sub-pixel is coincident with a fourth vertex of the first virtual diamond.

19 Claims, 13 Drawing Sheets

(51) Int. Cl.
*H01L 27/12* (2006.01)
*H01L 27/32* (2006.01)

(52) U.S. Cl.
CPC ...... *H01L 27/3262* (2013.01); *H01L 27/3265* (2013.01); *G09G 2300/0439* (2013.01); *G09G 2300/0819* (2013.01); *G09G 2310/0264* (2013.01); *G09G 2320/02* (2013.01)

(58) Field of Classification Search
CPC .. G09G 3/3225; G09G 3/3233; G09G 3/3241; G09G 3/325; G09G 3/3258; G09G 2300/0439; G09G 2300/0452
USPC ............ 345/76–83, 87–104; 315/169.3
See application file for complete search history.

(56) References Cited

U.S. PATENT DOCUMENTS

| | | | | |
|---|---|---|---|---|
| 2013/0057521 A1* | 3/2013 | Kim | ............... | H01L 27/3216 345/204 |
| 2013/0234917 A1* | 9/2013 | Lee | ............... | H01L 27/3218 345/82 |
| 2014/0071030 A1* | 3/2014 | Lee | ............... | G09G 3/3208 345/82 |
| 2015/0015465 A1* | 1/2015 | Gong | ............... | G09G 3/3208 345/76 |
| 2015/0016103 A1 | 1/2015 | Peng | | |
| 2015/0116375 A1* | 4/2015 | Yang | ............... | G09G 3/2003 345/690 |
| 2016/0055808 A1* | 2/2016 | Guo | ............... | G09G 3/3607 345/694 |
| 2016/0189669 A1* | 6/2016 | Yang | ............... | G06T 3/40 345/589 |
| 2017/0047382 A1 | 2/2017 | Huangfu et al. | | |
| 2018/0069057 A1* | 3/2018 | Lee | ............... | H01L 27/3218 |
| 2018/0247984 A1* | 8/2018 | Wang | ............... | H01L 27/12 |
| 2019/0140030 A1* | 5/2019 | Huangfu | ............... | G09G 3/3233 |
| 2019/0206313 A1* | 7/2019 | Xia | ............... | G09G 3/3225 |
| 2019/0252469 A1* | 8/2019 | Xiao | ............... | G09G 3/3225 |

FOREIGN PATENT DOCUMENTS

| | | |
|---|---|---|
| CN | 104576696 A | 4/2015 |
| CN | 104681594 A | 6/2015 |
| CN | 204391118 U | 6/2015 |
| CN | 105976757 A | 9/2016 |
| JP | 2006-201485 A | 8/2006 |

OTHER PUBLICATIONS

The International Search Report and Written Opinion dated May 31, 2017; PCT/CN2017073790.

The Second Chinese Office Action dated Aug. 9, 2018: Appln. No. 201610596086.8.

\* cited by examiner

OLED PIXEL ARRANGEMENT STRUCTURE HAVING PIXEL UNIT OF FOUR SUB-PIXELS CONFIGURED FOR IMPROVING DISPLAY RESOLUTION

TECHNICAL FIELD

Embodiments of the present disclosure relate to a pixel arrangement structure, a pixel circuit, a display panel and a driving method.

BACKGROUND

In the display field, organic light-emitting diode (OLED) display panels have wide development prospective due to the characteristics of autoluminescence, high contrast, small thickness, wide viewing angle, rapid response speed, capability of being applied to a flexible panel, wide range of service temperature, simple production, etc.

Due to the above characteristics, an OLED display panel is applicable to a device with display function such as a mobile phone, a display, a notebook computer, a digital camera, an instrument or the like.

SUMMARY

An embodiment of the present disclosure a pixel arrangement structure, comprising: a first pixel unit including a first sub-pixel, a second sub-pixel, a third sub-pixel and a fourth sub-pixel, wherein a center of the first sub-pixel is coincident with a first vertex of a first virtual diamond; a center of the second sub-pixel is coincident with a second vertex of the first virtual diamond; a center of the third sub-pixel is coincident with a third vertex of the first virtual diamond; and a center of the fourth sub-pixel is coincident with a fourth vertex of the first virtual diamond.

For example, in the pixel arrangement structure of an embodiment of the present disclosure, the first vertex, the second vertex, the third vertex and the fourth vertex of the first virtual diamond are adjacent to each other in sequence; the first sub-pixel and the third sub-pixels are rectangles; and the second sub-pixel and the fourth sub-pixel are triangles.

For example, in the pixel arrangement structure of an embodiment of the present disclosure, the rectangles are squares; and the triangles are isosceles triangles.

For example, in the pixel arrangement structure of an embodiment of the present disclosure, a perpendicular bisector of one side of the rectangles runs through a center of the first virtual diamond; and a perpendicular bisector of one side of the triangles runs through the center of the first virtual diamond.

For example, in the pixel arrangement structure of an embodiment of the present disclosure, the first sub-pixel emits light of first color in a working process; the second sub-pixel emits light of second color in the working process; the third sub-pixel emits light of third color in the working process; and the fourth sub-pixel emits light of fourth color in the working process.

For example, in the pixel arrangement structure of an embodiment of the present disclosure, a mixed color of the second color and the fourth color is the first color or the third color.

For example, in the pixel arrangement structure of an embodiment of the present disclosure, a mixed color of the first color and the third color is white.

For example, in the pixel arrangement structure of an embodiment of the present disclosure, the first color is blue; the second color is green; the third color is yellow; and the fourth color is red.

For example, the pixel arrangement structure of an embodiment of the present disclosure further comprises: a second pixel unit including a fifth sub-pixel, a sixth sub-pixel, a seventh sub-pixel and an eighth sub-pixel, wherein a center of the fifth sub-pixel is coincident with a first vertex of a second virtual diamond; a center of the sixth sub-pixel is coincident with a second vertex of the second virtual diamond; a center of the seventh sub-pixel is coincident with a third vertex of the second virtual diamond; and a center of the eighth sub-pixel is coincident with a fourth vertex of the second virtual diamond; and a third pixel unit including a ninth sub-pixel, a tenth sub-pixel, an eleventh sub-pixel and a twelfth sub-pixel, wherein a center of the ninth sub-pixel is coincident with a first vertex of a third virtual diamond; a center of the tenth sub-pixel is coincident with a second vertex of the third virtual diamond; a center of the eleventh sub-pixel is coincident with a third vertex of the third virtual diamond; a center of the twelfth sub-pixel is coincident with a fourth vertex of the third virtual diamond, wherein a center of the first virtual diamond is coincident with a first vertex of a virtual triangle; a center of the second virtual diamond is coincident with a second vertex of the virtual triangle; and a center of the third virtual diamond is coincident with a third vertex of the virtual triangle.

For example, in the pixel arrangement structure of an embodiment of the present disclosure, the virtual triangle is an acute triangle.

For example, in the pixel arrangement structure of an embodiment of the present disclosure, the virtual triangle is an isosceles acute triangle.

For example, in the pixel arrangement structure of an embodiment of the present disclosure, the virtual triangle is an equilateral triangle.

For example, in the pixel arrangement structure of an embodiment of the present disclosure, the first virtual diamond, the second virtual diamond and the third virtual diamond have a same shape.

For example, in the pixel arrangement structure of an embodiment of the present disclosure, the first vertex, the second vertex, the third vertex and the fourth vertex of the first virtual diamond are adjacent to each other in sequence; the first vertex, the second vertex, the third vertex and the fourth vertex of the second virtual diamond are adjacent to each other in sequence; the first vertex, the second vertex, the third vertex and the fourth vertex of the third virtual diamond are adjacent to each other in sequence; the first sub-pixel, the fifth sub-pixel and the ninth sub-pixel have a same shape; the second sub-pixel, the sixth sub-pixel and the tenth sub-pixel have a same shape; the third sub-pixel, the seventh sub-pixel and the eleventh sub-pixel have a same shape; and the fourth sub-pixel, the eighth sub-pixel and the twelfth sub-pixel have a same shape.

For example, in the pixel arrangement structure of an embodiment of the present disclosure, the first sub-pixel, the third sub-pixel, the fifth sub-pixel, the seventh sub-pixel, the ninth sub-pixel and the eleventh sub-pixel are rectangles; and the second sub-pixel, the fourth sub-pixel, the sixth sub-pixel, the eighth sub-pixel, the tenth sub-pixel and the twelfth sub-pixel are triangles.

For example, in the pixel arrangement structure of an embodiment of the present disclosure, the rectangles are squares; and the triangles are isosceles triangles.

For example, in the pixel arrangement structure of an embodiment of the present disclosure, a perpendicular bisector of one side of the rectangles runs through a center of one virtual diamond; and a perpendicular bisector of one side of the triangles runs through a center of one virtual diamond.

For example, in the pixel arrangement structure of an embodiment of the present disclosure, the first sub-pixel, the fifth sub-pixel and the ninth sub-pixel emit light of first color in a working process; the second sub-pixel, the sixth sub-pixel and the tenth sub-pixel emit light of second color in the working process; the third sub-pixel, the seventh sub-pixel and the eleventh sub-pixel emit light of third color in the working process; and the fourth sub-pixel, the eighth sub-pixel and the twelfth sub-pixel emit light of fourth color in the working process.

For example, in the pixel arrangement structure of an embodiment of the present disclosure, a mixed color of the second color and the fourth color is the first color or the third color.

For example, in the pixel arrangement structure of an embodiment of the present disclosure, a mixed color of the first color and the third color is white.

For example, in the pixel arrangement structure of an embodiment of the present disclosure, the first color is blue; the second color is green; the third color is yellow; and the fourth color is red.

An embodiment of the present disclosure provides a pixel circuit, comprising: a first light-emitting circuit configured to emit light in a working process; a first drive circuit configured to drive the first light-emitting circuit; a first compensating circuit configured to compensate the first drive circuit; a first data write circuit configured to write data into the first drive circuit; a first reset circuit configured to reset the first drive circuit; a first storage circuit configured to store a drive voltage of the first drive circuit; a first initializing circuit configured to initialize the first light-emitting circuit; a first emission control circuit configured to control an on- and off-state of the first light-emitting circuit; a first power end configured to provide a first luminous voltage for the first light-emitting circuit; a second power end configured to provide a second luminous voltage for the first light-emitting circuit; a third power end configured to provide a reset voltage for the first reset circuit; a first data signal end configured to provide a first data signal and/or a standby signal for the first data write circuit; a first control end configured to provide a first control signal for controlling an on- and off-state of the first reset circuit; a second control end configured to provide a second control signal for controlling on- and off-states of the first data write circuit and the first compensating circuit; a third control end configured to provide a third control signal for controlling an on- and off-state of the first initializing circuit; and a fourth control end configured to provide a fourth control signal for controlling an on- and off-state of the first emission control circuit.

For example, in the pixel circuit of an embodiment of the present disclosure, the first data write circuit includes a first transistor; the first emission control circuit includes a second transistor and a fifth transistor; the first compensating circuit includes a third transistor; the first drive circuit includes a fourth transistor; the first reset circuit includes a sixth transistor; the first initializing circuit includes a seventh transistor; the first storage circuit includes a first storage capacitor; and the first light-emitting circuit includes a first organic light-emitting diode (OLED).

For example, in the pixel circuit of an embodiment of the present disclosure, a source electrode of the first transistor is electrically connected with the first data signal end; a gate electrode of the first transistor and a gate electrode of the third transistor are electrically connected with the second control end; a drain electrode of the first transistor, a drain electrode of the second transistor, a source electrode of the third transistor, and a source electrode of the fourth transistor are electrically connected with each other; a gate electrode of the second transistor and a gate electrode of the fifth transistor are electrically connected with the fourth control end; a source electrode of the second transistor and a first end of the first storage capacitor are electrically connected with the first power end; a drain electrode of the third transistor is electrically connected with a first node; a gate electrode of the fourth transistor is electrically connected with the first node; a drain electrode of the fourth transistor is electrically connected with a source electrode of the fifth transistor; a drain electrode of the fifth transistor and a drain electrode of the seventh transistor are electrically connected with a first end of the first OLED; a source electrode of the sixth transistor and a source electrode of the seventh transistor are electrically connected with the third power end; a gate electrode of the sixth transistor is electrically connected with the first control end; a drain electrode of the sixth transistor is electrically connected with the first node; a gate electrode of the seventh transistor is electrically connected with the third control end; a second end of the first storage capacitor is electrically connected with the first node; and a second end of the first OLED is electrically connected with the second power end.

For example, in the pixel circuit of an embodiment of the present disclosure, the first transistor, the second transistor, the third transistor, the fourth transistor, the fifth transistor, the sixth transistor and the seventh transistor are all thin-film transistors (TFTs).

For example, in the pixel circuit of an embodiment of the present disclosure, the first transistor, the second transistor, the third transistor, the fourth transistor, the fifth transistor, the sixth transistor and the seventh transistor are all P-type transistors.

An embodiment of the present disclosure provides a pixel circuit, comprising: a second light-emitting circuit configured to emit light in a working process; a second drive circuit configured to drive the second light-emitting circuit; a second compensating circuit configured to compensate the second drive circuit; a second data write circuit configured to write data into the second drive circuit; a second reset circuit configured to reset the second drive circuit; a second storage circuit configured to store a drive voltage of the second drive circuit; a second initializing circuit configured to initialize the second light-emitting circuit; a second emission control circuit configured to control an on- and off-state of the second light-emitting circuit; an election circuit configured to transmit a second data signal or a third data signal to the second data write circuit; a first power end configured to provide a first luminous voltage for the second light-emitting circuit; a second power end configured to provide a second luminous voltage for the second light-emitting circuit; a third power end configured to provide a reset voltage for the second reset circuit; a second data signal end configured to provide the second data signal or a standby signal for the second data write circuit; a third data signal end configured to provide the third data signal or a standby signal for the second data write circuit; a first control end configured to provide a first control signal for controlling an on- and off-state of the second reset circuit; a second control end configured to provide a second control signal for controlling on- and off-states of the second data write circuit and the second compensating circuit; a third control end configured to provide a third control signal for controlling an on- and off-state of the second initializing circuit; and a fourth control end configured to provide a fourth control signal for controlling an on- and off-state of the second emission control circuit.

For example, in the pixel circuit of an embodiment of the present disclosure, the second data write circuit includes an eighth transistor; the second emission control circuit includes a ninth transistor and a twelfth transistor; the second compensating circuit includes a tenth transistor; the second drive circuit includes an eleventh transistor; the second reset circuit includes a thirteenth transistor; the second initializing circuit includes a fourteenth transistor; the second storage circuit includes a second storage capacitor; the second light-emitting circuit includes a second OLED, a third OLED, a fifteenth transistor and a sixteenth transistor; and the election circuit includes a seventeenth transistor and an eighteenth transistor.

For example, in the pixel circuit of an embodiment of the present disclosure, a source electrode of the eighth transistor, a drain electrode of the seventeenth transistor, and a drain electrode of the eighteenth transistor are electrically connected with each other; a gate electrode of the eighth transistor and a gate electrode of the tenth transistor are electrically connected with the second control end; a drain electrode of the eighth transistor, a drain electrode of the ninth transistor, a source electrode of the tenth transistor, and a source electrode of the eleventh transistor are electrically connected with each other; a gate electrode of the ninth transistor and a gate electrode of the twelfth transistor are electrically connected with the fourth control end; a source electrode of the ninth transistor and a first end of the second storage capacitor are electrically connected with the first power end; a drain electrode of the tenth transistor is electrically connected with a second node; a gate electrode of the eleventh transistor is electrically connected with the second node; a drain electrode of the eleventh transistor is electrically connected with a source electrode of the twelfth transistor; a drain electrode of the twelfth transistor, a drain electrode of the fourteenth transistor, a source electrode of the fifteenth transistor, and a source electrode of the sixteenth transistor are electrically connected with a third node; a source electrode of the thirteenth transistor and a source electrode of the fourteenth transistor are electrically connected with the third power end; a gate electrode of the thirteenth transistor is electrically connected with the first control end; a drain electrode of the thirteenth transistor is electrically connected with the second node; a gate electrode of the fourteenth transistor is electrically connected with the third control end; a gate electrode of the fifteenth transistor is electrically connected with the second data signal end; a drain electrode of the fifteenth transistor is electrically connected with a first end of the second OLED; a gate electrode of the sixteenth transistor is electrically connected with the third data signal end; a drain electrode of the sixteenth transistor is electrically connected with a first end of the third OLED; a source electrode of the seventeenth transistor is electrically connected with the second data signal end; a gate electrode of the seventeenth transistor is electrically connected with the third data signal end; a source electrode of the eighteenth transistor is electrically connected with the third data signal end; a gate electrode of the eighteenth transistor is electrically connected with the second data signal end; a second end of the second storage capacitor is electrically connected with the second node; and a second end of the second OLED and a second end of the third OLED are electrically connected with the second power end.

For example, in the pixel circuit of an embodiment of the present disclosure, the eighth transistor, the ninth transistor, the tenth transistor, the eleventh transistor, the twelfth transistor, the thirteenth transistor, the fourteenth transistor, the fifteenth transistor, the sixteenth transistor, the seventeenth transistor and the eighteenth transistor are all TFTs.

For example, in the pixel circuit of an embodiment of the present disclosure, the eighth transistor, the ninth transistor, the tenth transistor, the eleventh transistor, the twelfth transistor, the thirteenth transistor, the fourteenth transistor, the fifteenth transistor, the sixteenth transistor, the seventeenth transistor and the eighteenth transistor are all N-type transistors.

An embodiment of the present disclosure provides a display panel, comprising the above-mentioned pixel arrangement structure of any one embodiment of the present disclosure.

An embodiment of the present disclosure provides a display panel, comprising the pixel circuit of any one embodiment of the present disclosure.

For example, the display panel of an embodiment of the present disclosure further comprises the pixel arrangement structure according to any one of the embodiments of the present disclosure; wherein the first light-emitting circuit in the pixel circuit according to any one of the embodiments of the present disclosure emits blue or yellow light in the working process; and the second light-emitting circuit in the pixel circuit according to any one of the embodiments of the present disclosure emits red or green light in the working process.

An embodiment of the present disclosure provides a driving method of the pixel circuit, comprising: a reset period, a compensation period, an initialization period and an emission period; in the reset period, the first control signal outputs a valid signal; the second control end outputs an invalid signal; the third control end outputs an invalid signal; the fourth control end outputs an invalid signal; the first data signal end outputs a standby signal; in the compensation period, the first control signal outputs an invalid signal; the second control end outputs a valid signal; the third control end outputs an invalid signal; the fourth control end outputs an invalid signal; the first data signal end outputs a first data signal; in the initialization period, the first control signal outputs an invalid signal; the second control end outputs an invalid signal; the third control end outputs a valid signal; the fourth control end outputs an invalid signal; the first data signal end outputs a first data signal; and in the emission period, the first control signal outputs an invalid signal; the second control end outputs an invalid signal; the third control end outputs an invalid signal; the fourth control end outputs a valid signal; and the first data signal end outputs a first data signal.

For example, the driving method of the above embodiment may further comprises: a pre-reset period and a pre-emission period; the pre-reset period is after the emission period and before the reset period, and the pre-emission period is after the initialization period and before the emission period; in the pre-reset period, the first control signal outputs an invalid signal; the second control end outputs an invalid signal; the third control end outputs an invalid signal; the fourth control end outputs an invalid signal; the first data signal end outputs a standby signal; in the pre-emission period, the first control signal outputs an invalid signal; the second control end outputs an invalid signal; the third control end outputs an invalid signal; the fourth control end outputs an invalid signal; and the first data signal end outputs a first data signal.

An embodiment of the present disclosure further provides a driving method of the pixel circuit, comprising: a reset period, a compensation period, an initialization period and an emission period; in the reset period, the first control end outputs a valid signal; the second control end outputs an invalid signal; the third control end outputs an invalid signal; the fourth control end outputs an invalid signal; the second data signal end outputs a standby signal; the third data signal end outputs a standby signal; in the compensation period, the first control end outputs an invalid signal; the second control end outputs a valid signal; the third control end outputs an invalid signal; the fourth control end outputs an invalid signal; the second data signal end outputs a second data signal; the third data signal end outputs a standby signal; in the initialization period, the first control end outputs an invalid signal; the second control end outputs an invalid signal; the third control end outputs a valid signal; the fourth control end outputs an invalid signal; the second data signal end outputs a second data signal; the third data signal end outputs a standby signal; in the emission period, the first control end outputs an invalid signal; the second control end outputs an invalid signal; the third control end outputs an invalid signal; the fourth control end outputs a valid signal; the second data signal end outputs a second data signal; the third data signal end outputs a standby signal; or in the reset period, the first control end outputs a valid signal; the second control end outputs an invalid signal; the third control end outputs an invalid signal; the fourth control end outputs an invalid signal; the second data signal end outputs a standby signal; the third data signal end outputs a standby signal; in the compensation period, the first control end outputs an invalid signal; the second control end outputs a valid signal; the third control end outputs an invalid signal; the fourth control end outputs an invalid signal; the second data signal end outputs a standby signal; the third data signal end outputs a third data signal; in the initialization period, the first control end outputs an invalid signal; the second control end outputs an invalid signal; the third control end outputs a valid signal; the fourth control end outputs an invalid signal; the second data signal end outputs a standby signal; the third data signal end outputs a third data signal; in the emission period, the first control end outputs an invalid signal; the second control end outputs an invalid signal; the third control end outputs an invalid signal; the fourth control end outputs a valid signal; the second data signal end outputs a standby signal; and the third data signal end outputs a third data signal.

For example, the driving method according to the above embodiment further comprises: a pre-reset period and a pre-emission period; the pre-reset period is after the emission period and before the reset period, and the pre-emission period is after the initialization period and before the emission period; in the pre-reset period, the first control end outputs an invalid signal; the second control end outputs an invalid signal; the third control end outputs an invalid signal; the fourth control end outputs an invalid signal; the second data signal end outputs a standby signal; the third data signal end outputs a standby signal; in the pre-emission period, the first control end outputs an invalid signal; the second control end outputs an invalid signal; the third control end outputs an invalid signal; the fourth control end outputs an invalid signal; the second data signal end outputs a second data signal and the third data signal end outputs a standby signal, or the second data signal end outputs a standby signal and the third data signal end outputs a third data signal.

The pixel arrangement structure, the pixel circuit, the display panel and the driving method can reduce the distance between the sub-pixels and meanwhile reduce the occupied area of the pixel circuit, and hence improve the resolution of the display panel, and can perform initializing discharge on OLEDs in the driving process, ensure the accuracy at a low gray scale and full black under full-dark-state images, and effectively improve the contrast of the entire display panel.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 8E is a schematic diagram illustrating the conducting state in a pre-emission period when the pixel circuit as illustrated in. FIG. 6 provided by an embodiment of the present disclosure is driven by the drive timing as illustrated in FIG. 7;

DETAILED DESCRIPTION

Figure 1:
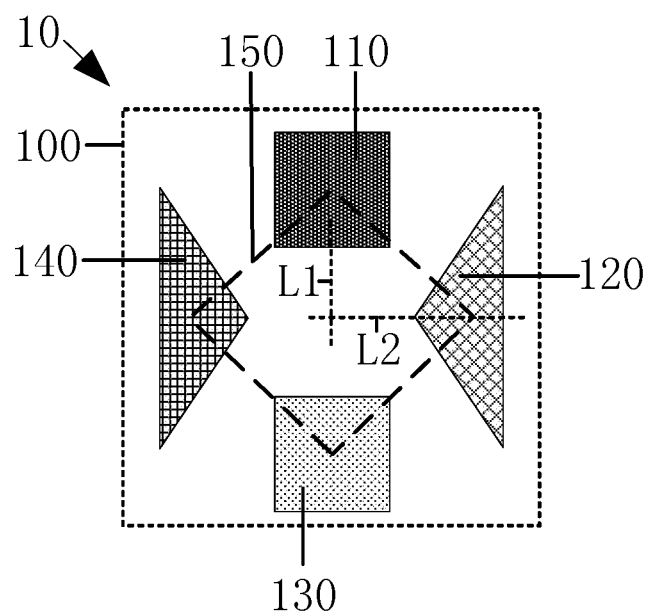
FIG. 1 is a first schematic diagram of a pixel arrangement structure provided by an embodiment of the present disclosure.

Clear and complete description will be given below to the technical proposals of the embodiments of the present disclosure to provide more comprehensive description on the preferred embodiments of the present disclosure and a variety of characteristics and favorable details thereof, with reference to the accompanying drawings and non-limiting preferred embodiments shown in the accompanying drawings and described in detail in the following description. It should be noted that the characteristics shown in the figures are not drawn in scale. The present disclosure omits the description on the known materials, components and process techniques, thereby not obscuring the preferred embodiments of the present disclosure. The given examples are only intended to facilitate an understanding of the implementation of the preferred embodiments of the present disclosure, so that the preferred embodiments can be further implemented by those skilled in the art. Therefore, the examples should not be construed as the limitation of the scope of the embodiments of the present disclosure.

Unless otherwise specified, the technical terms or scientific terms used in the present disclosure shall have normal meanings understood by those skilled in the art. The words "first", "second" and the like used in the present disclosure do not indicate any sequence, number or importance and are only intended to distinguish different components. In addition, in the embodiments of the present disclosure, same or similar reference numerals indicate same or similar members.

An organic light-emitting diode (OLED) display panel generally comprises a plurality of pixel units. Each pixel unit includes a plurality of sub-pixels provided with OLEDs capable of emitting light of different colors. The OLED in each sub-pixel may be driven by respective pixel circuit. However, as the occupied area of the pixel circuit is large, the area of the sub-pixels cannot be further reduced, so the resolution of the display panel can be disadvantageously affected.

Embodiments of the present disclosure provide a pixel arrangement structure, a pixel circuit, a display panel and a driving method, which can reduce the distance between sub-pixels and meanwhile reduce the occupied area of the pixel circuit, and hence improve the resolution of the display panel. Moreover, the embodiments can perform initializing discharge on OLEDs, ensure the accuracy at a low gray scale and full black under full-dark-state images, and hence effectively improve the contrast of the entire display panel.

For instance, as illustrated in FIG. 1, an embodiment of the present disclosure provides a pixel arrangement structure 10, which comprises a first pixel unit 100. The first pixel unit 100 includes a first sub-pixel 110, a second sub-pixel 120, a third sub-pixel 130 and a fourth sub-pixel 140; the center of the first sub-pixel 110 is coincident with a first vertex of a first virtual diamond 150; the center of the second sub-pixel 120 is coincident with a second vertex of the first virtual diamond 150; the center of the third sub-pixel 130 is coincident with a third vertex of the first virtual diamond 150; and the center of the fourth sub-pixel 140 is coincident with a fourth vertex of the first virtual diamond 150.

It should be noted that the first virtual diamond 150 is only used for illustrating the positional relationships among the first sub-pixel 110, the second sub-pixel 120, the third sub-pixel 130 and the fourth sub-pixel 140. In an actual pixel arrangement structure 10, the actual structure of the first virtual diamond 150 does not exist.

For instance, in the pixel arrangement structure 10 provided by an embodiment of the present disclosure, the first vertex, the second vertex, the third vertex and the fourth vertex of the first virtual diamond 150 are adjacent to each other in sequence. That is to say, the first sub-pixel 110, the second sub-pixel 120, the third sub-pixel 130 and the fourth sub-pixel 140 are adjacent to each other in sequence. For instance, as illustrated in FIG. 1, the first sub-pixel 110, the second sub-pixel 120, the third sub-pixel 130 and the fourth sub-pixel 140 are arranged clockwise.

For instance, the first sub-pixel 110 and the third sub-pixel 130 are in shapes of rectangles, and the second sub-pixel 120 and the fourth sub-pixel 140 are in shapes of triangles.

For instance, in the pixel arrangement structure 10 provided by an embodiment of the present disclosure, the first sub-pixel 110 and the third sub-pixel 130 are squares, and the second sub-pixel 120 and the fourth sub-pixel 140 are isosceles triangles.

For instance, in the pixel arrangement structure 10 provided by an embodiment of the present disclosure, as illustrated in FIG. 1, a perpendicular bisector L1 of one side of the first sub-pixel 110 runs through the center of the first virtual diamond 150; a perpendicular bisector L2 of a base of the second sub-pixel 120 runs through the center of the first virtual diamond 150; a perpendicular bisector (not shown in the figure) of one side of the third sub-pixel 130 runs through the center of the first virtual diamond 150; and a perpendicular bisector (not shown in the figure) of a base of the fourth sub-pixel 140 runs through the center of the first virtual diamond 150. That is to say, the first sub-pixel 110, the second sub-pixel 120, the third sub-pixel 130 and the fourth sub-pixel 140 are arranged facing the center of the first virtual diamond 150.

It should be noted that the arrangement mode of the first sub-pixel 110, the second sub-pixel 120, the third sub-pixel 130 and the fourth sub-pixel 140 includes but not limited to the case as illustrated in FIG. 1 and may also adopt other arrangement modes. For instance, one vertex of the first sub-pixel faces the center of the first virtual diamond; one vertex of the second sub-pixel faces the center of the first virtual diamond; one vertex of the third sub-pixel faces the center of the first virtual diamond; and one vertex of the fourth sub-pixel faces the center of the first virtual diamond.

For instance, the pixel arrangement structure provided by an embodiment of the present disclosure can reduce the distance between the sub-pixels, arrange more sub-pixels per unit area, and hence improve the display resolution.

For instance, in the pixel arrangement structure 10 provided by an embodiment of the present disclosure, the first sub-pixel 110 emits light of first color in a working process; the second sub-pixel 120 emits light of second color in a working process; the third sub-pixel 130 emits light of third color in a working process; and the fourth sub-pixel 140 emits light of fourth color in a working process.

For instance, in the pixel arrangement structure 10 provided by an embodiment of the present disclosure, a mixed color of the second color and the fourth color may be the first color or the third color. For instance, a mixed color of the first color and the third color may be white.

For instance, in the pixel arrangement structure 10 provided by an embodiment of the present disclosure, the first color is blue; the second color is green; the third color is yellow; and the fourth color is red. The mixed color of the second color green and the fourth color red is the third color, that is, yellow, and the mixed color of the first color blue and the third color yellow is white.

For instance, in the case of displaying a monochromatic image, a sub-pixel of corresponding color emits light independently; in the case of displaying a gray-scale image (e.g., a white-black image), only the first sub-pixel and the third sub-pixel emit light; in the case of displaying a multicolor image in which the gray scale of the fourth color is high, the light of the third color emitted by the third sub-pixel may be adopted to replace the mixed color of the light of the second color emitted by the second sub-pixel and the light of the fourth color emitted by the fourth sub-pixel, and meanwhile, the light of the fourth color emitted by the fourth sub-pixel is taken as a supplement, namely only the first sub-pixel, the third sub-pixel and the fourth sub-pixel emit light, and the second sub-pixel does not emit light; and in the case of displaying a multicolor image in which the gray scale of the second color is high, the light of the third color emitted by the third sub-pixel may also be adopted to replace the mixed color of the light of the second color emitted by the second sub-pixel and the light of the fourth color emitted by the fourth sub-pixel, and meanwhile, the light of the second color emitted by the second sub-pixel is taken as a supplement, namely only the first sub-pixel, the second sub-pixel and the third sub-pixel emit light, and the fourth sub-pixel does not emit light. In this way, only two sub-pixels emit light in the case of displaying a gray-scale image, and only three sub-pixels emit light in the case of displaying a multicolor image, so the energy can be saved.

For instance, the pixel arrangement structure provided by an embodiment of the present disclosure adopts pixels with four colors for display and can ensure a balanced pixel ratio and a wide color gamut for various kinds of images.

It should be noted that the embodiment of the present disclosure includes but not limited to the case of adopting blue as the first color, green as the second color, yellow as the third color, and red as the fourth color. The combination of display colors may be flexibly adjusted according to actual display demands.

Figure 2:
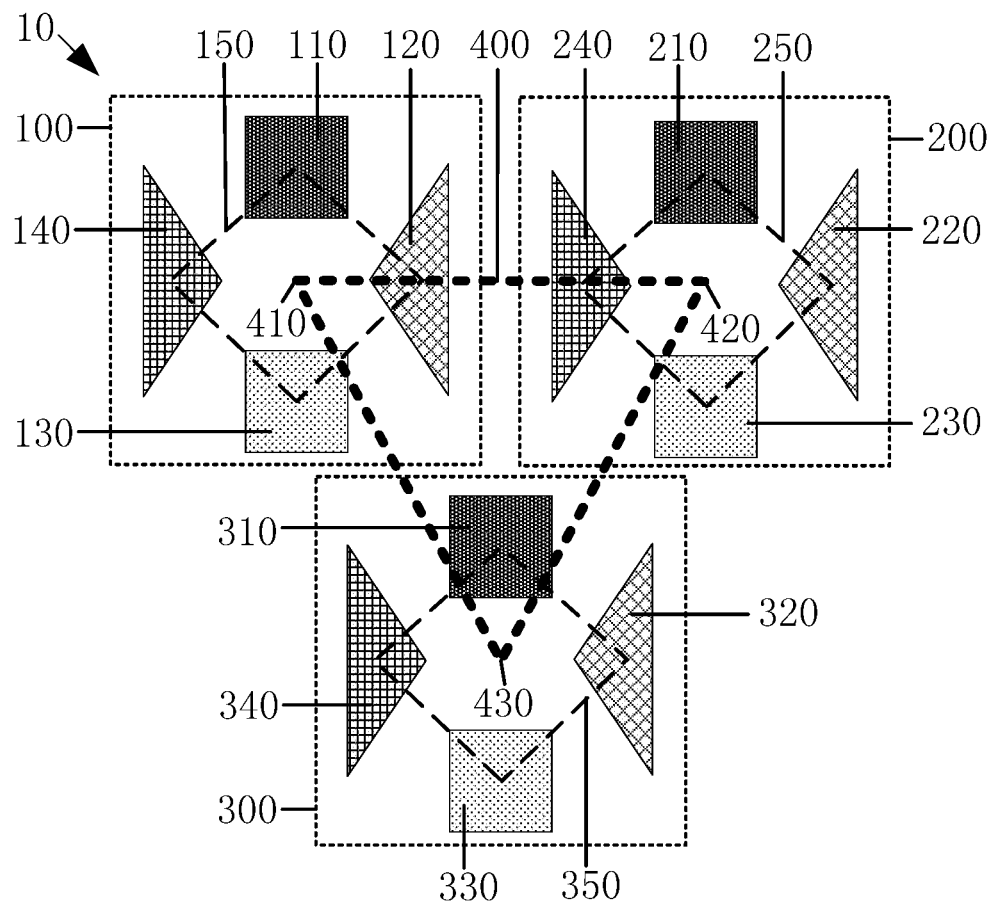
FIG. 2 is a second schematic diagram of the pixel arrangement structure provided by an embodiment of the present disclosure.

For instance, as illustrated in FIG. 2, the pixel arrangement structure 10 provided by an embodiment of the present disclosure may further comprise a second pixel unit 200 and a third pixel unit 300. The second pixel unit 200 includes a fifth sub-pixel 210, a sixth sub-pixel 220, a seventh sub-pixel 230 and an eighth sub-pixel 240. The center of the fifth sub-pixel 210 is coincident with a first vertex of a second virtual diamond 250; the center of the sixth sub-pixel 220 is coincident with a second vertex of the second virtual diamond 250; the center of the seventh sub-pixel 230 is coincident with a third vertex of the second virtual diamond 250; and the center of the eighth sub-pixel 240 is coincident with a fourth vertex of the second virtual diamond 250. The third pixel unit 300 includes a ninth sub-pixel 310, a tenth sub-pixel 320, an eleventh sub-pixel 330 and a twelfth sub-pixel 340. The center of the ninth sub-pixel 310 is coincident with a first vertex of a third virtual diamond 350; the center of the tenth sub-pixel 320 is coincident with a second vertex of the third virtual diamond 350; the center of the eleventh sub-pixel 330 is coincident with a third vertex of the third virtual diamond 350; and the center of the twelfth sub-pixel 340 is coincident with a fourth vertex of the third virtual diamond 350. For instance, the center of the first virtual diamond 150 is coincident with a first vertex 410 of a virtual triangle 400; the center of the second virtual diamond 250 is coincident with a second vertex 420 of the virtual triangle 400; and the center of the third virtual diamond 350 is coincident with a third vertex 430 of the virtual triangle 400.

It should be noted that the second virtual diamond 250 and the third virtual diamond 350 are only used for illustrating the positional relationships between corresponding sub-pixels, and the virtual triangle 400 is only used for illustrating the positional relationships among the first pixel unit 100, the second pixel unit 200 and the third pixel unit 300. In an actual pixel arrangement structure 10, the actual structures of the second virtual diamond 250, the third virtual diamond 350 and the virtual triangle 400 do not exist.

For instance, in the pixel arrangement structure 10 provided by an embodiment of the present disclosure, the virtual triangle 400 is an acute triangle. That is to say, the third pixel unit 300 is not aligned with the first pixel unit 100 or the second pixel unit 200 in the vertical direction, but disposed between the first pixel unit 100 and the second pixel unit 200 in the vertical direction. The arrangement mode can further reduce the distance between the sub-pixels, and hence improve the display resolution.

For instance, in the pixel arrangement structure 10 provided by an embodiment of the present disclosure, the virtual triangle 400 is an isosceles acute triangle.

Moreover, for instance, in the pixel arrangement structure 10 provided by an embodiment of the present disclosure, the virtual triangle 400 is an equilateral triangle.

For instance, in the pixel arrangement structure 10 provided by an embodiment of the present disclosure, the first virtual diamond 150, the second virtual diamond 250 and the third virtual diamond 350 have a same shape.

For instance, in the pixel arrangement structure 10 provided by an embodiment of the present disclosure, the first vertex, the second vertex, the third vertex and the fourth vertex of the first virtual diamond 150 are adjacent to each other in sequence; the first vertex, the second vertex, the third vertex and the fourth vertex of the second virtual diamond 250 are adjacent to each other in sequence; the first vertex, the second vertex, the third vertex and the fourth vertex of the third virtual diamond 350 are adjacent to each other in sequence; the first sub-pixel 110, the fifth sub-pixel 210 and the ninth sub-pixel 310 have a same shape; the second sub-pixel 120, the sixth sub-pixel 220 and the tenth sub-pixel 320 have a same shape; the third sub-pixel 130, the seventh sub-pixel 230 and the eleventh sub-pixel 330 have a same shape; and the fourth sub-pixel 140, the eighth sub-pixel 240 and the twelfth sub-pixel 340 have a same shape.

For instance, in the pixel arrangement structure 10 provided by an embodiment of the present disclosure, the first sub-pixel 110, the third sub-pixel 130, the fifth sub-pixel 210, the seventh sub-pixel 230, the ninth sub-pixel 310 and the eleventh sub-pixel 330 are rectangles, and the second sub-pixel 120, the fourth sub-pixel 140, the sixth sub-pixel 220, the eighth sub-pixel 240, the tenth sub-pixel 320 and the twelfth sub-pixel 340 are triangles.

For instance, in the pixel arrangement structure 10 provided by an embodiment of the present disclosure, the first sub-pixel 110, the third sub-pixel 130, the fifth sub-pixel 210, the seventh sub-pixel 230, the ninth sub-pixel 310 and the eleventh sub-pixel 330 are squares, and the second sub-pixel 120, the fourth sub-pixel 140, the sixth sub-pixel 220, the eighth sub-pixel 240, the tenth sub-pixel 320 and the twelfth sub-pixel 340 are isosceles triangles.

For instance, in the pixel arrangement structure 10 provided by an embodiment of the present disclosure, a perpendicular bisector of one side of the fifth sub-pixel 210 runs through the center of the second virtual diamond 250; a perpendicular bisector of one side of the seventh sub-pixel 230 runs through the center of the second virtual diamond 250; a perpendicular bisector of one side of the ninth sub-pixel 310 runs through the center of the third virtual diamond 350; and a perpendicular bisector of one side of the eleventh sub-pixel 330 runs through the center of the third virtual diamond 350.

For instance, a perpendicular bisector of a base of the sixth sub-pixel 220 runs through the center of the second virtual diamond 250; a perpendicular bisector of a base of the eighth sub-pixel 240 runs through the center of the second virtual diamond 250; a perpendicular bisector of a base of the tenth sub-pixel 320 runs through the center of the third virtual diamond 350; and a perpendicular bisector of a base of the twelfth sub-pixel 340 runs through the center of the third virtual diamond 350.

For instance, in the pixel arrangement structure 10 provided by an embodiment of the present disclosure, the first sub-pixel 110, the fifth sub-pixel 210 and the ninth sub-pixel 310 emit light of first color in a working process; the second sub-pixel 120, the sixth sub-pixel 220 and the tenth sub-pixel 320 emit light of second color in a working process; the third sub-pixel 130, the seventh sub-pixel 230 and the eleventh sub-pixel 330 emit light of third color in a working process; and the fourth sub-pixel 140, the eighth sub-pixel 240 and the twelfth sub-pixel 340 emit light of fourth color in a working process.

For instance, in the pixel arrangement structure 10 provided by an embodiment of the present disclosure, a mixed color of the second color and the fourth color is the first color or the third color.

For instance, in the pixel arrangement structure 10 provided by an embodiment of the present disclosure, a mixed color of the first color and the third color is white.

For instance, in the pixel arrangement structure 10 provided by an embodiment of the present disclosure, the first color is blue; the second color is green; the third color is yellow; and the fourth color is red.

For instance, in the case of displaying a monochromatic image, a sub-pixel of corresponding color emits light independently; in the case of displaying a gray-scale image (e.g., a white-black image), only the first sub-pixel, the third sub-pixel, the fifth sub-pixel, the seventh sub-pixel, the ninth sub-pixel and the eleventh sub-pixel emit light; in the case of displaying a multicolor image in which the gray scale of the fourth color is high, the light of the third color may be adopted to replace the mixed color of the light of the second color and the light of the fourth color, namely the second sub-pixel, the sixth sub-pixel and the tenth sub-pixel do not emit light; and in the case of displaying a multicolor image in which the gray scale of the second color is high, the light of the third color may also be adopted to replace the mixed color of the light of the second color and the light of the fourth color, namely the fourth sub-pixel, the eighth sub-pixel and the twelfth sub-pixel do not emit light. Thus, in the case of displaying a gray-scale image, only two sub-pixels in each pixel unit emit light; and in the case of displaying a multicolor image, only three sub-pixels in each pixel unit emit light, so the energy can be saved.

For instance, the pixel arrangement structure provided by an embodiment of the present disclosure adopts pixels with four colors for display and can ensure a balanced pixel ratio and a wide color gamut of various kinds of images.

Figure 3:
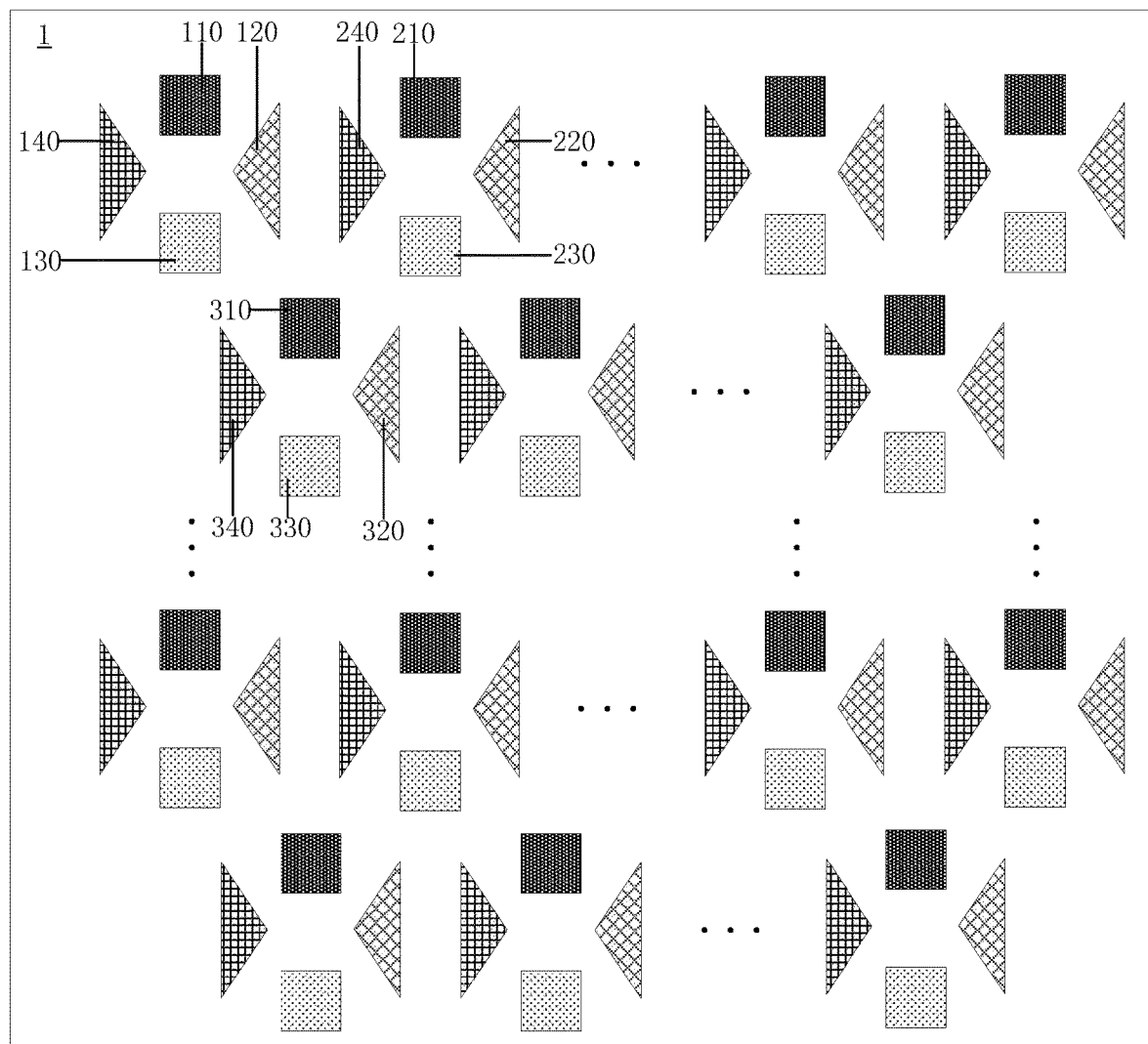
FIG. 3 is a first schematic diagram of a display panel provided by an embodiment of the present disclosure.

An embodiment of the present disclosure further provides a display panel 1. As illustrated in FIG. 3, the display panel 1 comprises the pixel arrangement structure provided by any embodiment of the present disclosure.

For instance, taking the case that the display panel 1 comprises m rows and n columns of pixels as an example, as illustrated in FIG. 3, the display panel 1 comprises a first sub-pixel 110, a second sub-pixel 120, a third sub-pixel 130, a fourth sub-pixel 140, a fifth sub-pixel 210, a sixth sub-pixel 220, a seventh sub-pixel 230, an eighth sub-pixel 240, a ninth sub-pixel 310, a tenth sub-pixel 320, an eleventh sub-pixel 330, a twelfth sub-pixel 340 . . . . The first sub-pixel 110, the second sub-pixel 120, the third sub-pixel 130, the fourth sub-pixel 140, the fifth sub-pixel 210, the sixth sub-pixel 220, the seventh sub-pixel 230 and the eighth sub-pixel 240 are disposed on the first row of the display panel 1. The ninth sub-pixel 310, the tenth sub-pixel 320, the eleventh sub-pixel 330 and the twelfth sub-pixel 340 are disposed on the second row of the display panel 1.

For instance, because the pixel arrangement structure will result in gaps in even rows of the display panel 1 as illustrated in FIG. 3, at positions close to the edges of the display panel, in order to fill in the gaps, sub-pixels may also be supplementarily provided at the edges of the display panel 1 according to actual conditions.

Figure 4:
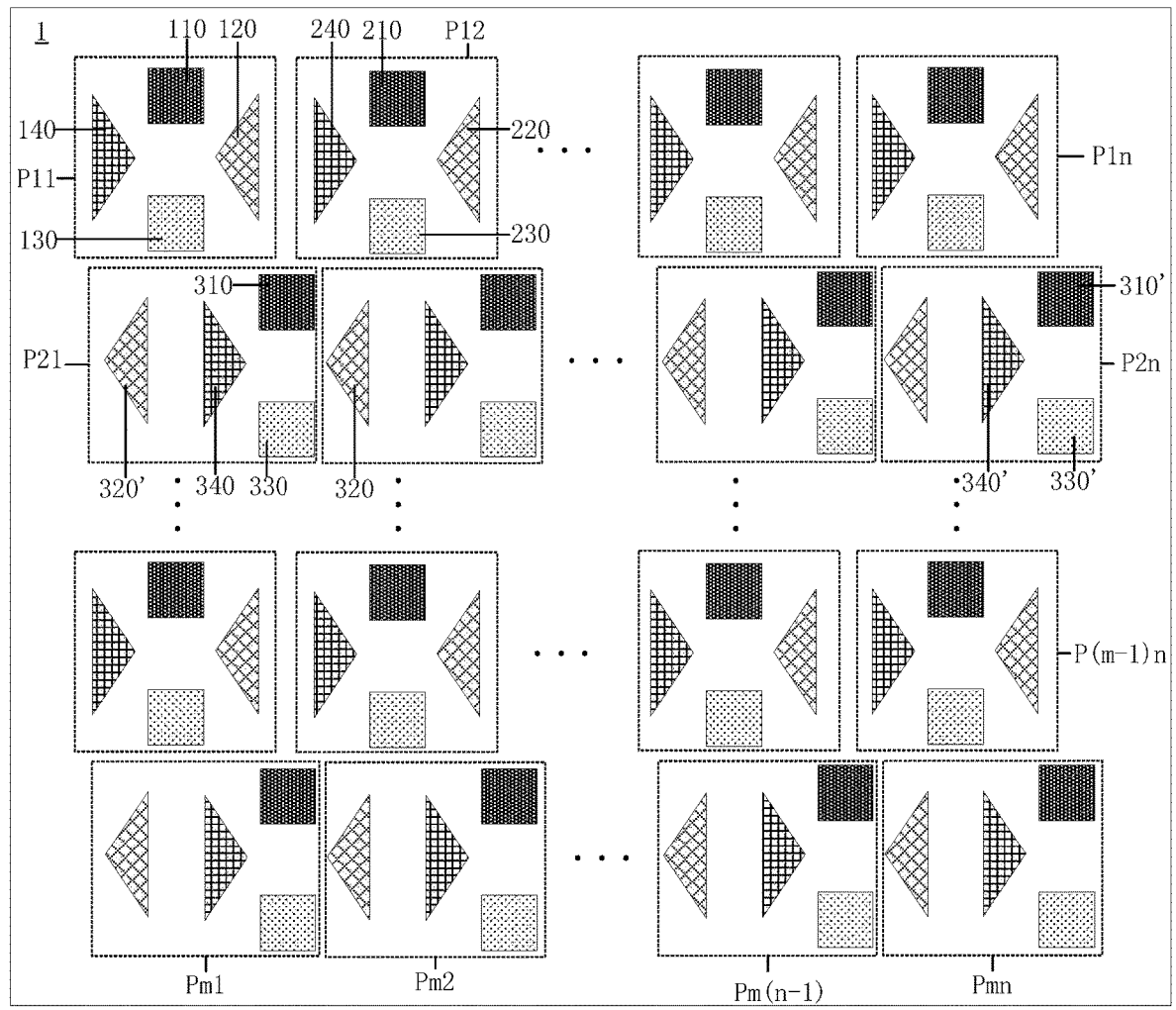
FIG. 4 is a second schematic diagram of the display panel provided by an embodiment of the present disclosure.

For instance, as illustrated in FIG. 4, a second supplementary sub-pixel 320' is supplemented at the left edge of the second row, and a first supplementary sub-pixel 310', a third supplementary sub-pixel 330' and a fourth supplementary sub-pixel 340' are supplemented at the right edge of the second row. Other gaps are also subjected to similar processing. Thus, the area of the display panel can be fully utilized, so as to ensure the uniform distribution of the sub-pixels and reduce or avoid the influence of the gaps at the edges of the display panel on the display effect.

For instance, in the example of filling in the supplementary sub-pixels, pixels may also be redistributed. As illustrated in FIG. 4, the first row of pixels are respectively P11, P12, . . . , P1*n* from left to right; and the first column of pixels are respectively P11, P21, . . . , Pm1 from the top down.

Figure 5:
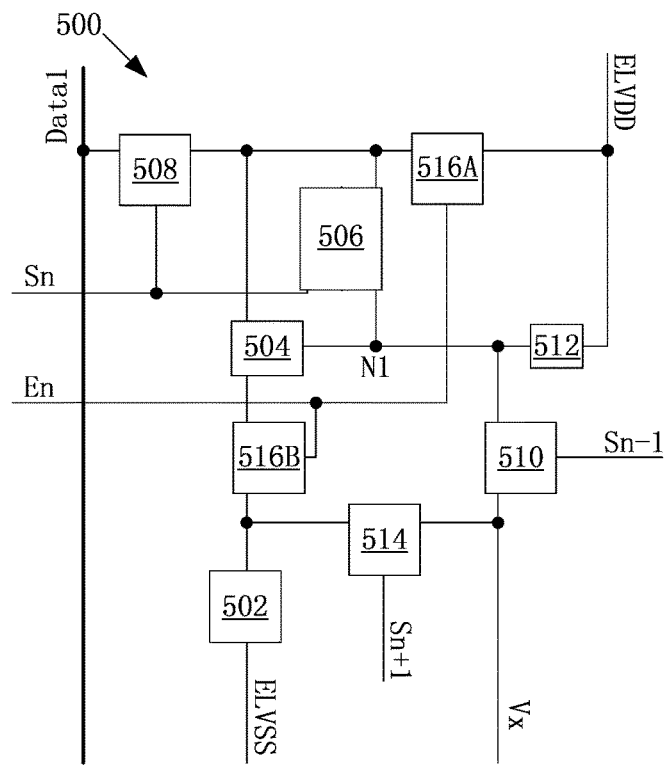
FIG. 5 is a first schematic diagram of a pixel circuit provided by an embodiment of the present disclosure.

For instance, FIG. 5 is a first schematic diagram of a pixel circuit provided by an embodiment of the present disclosure. As illustrated in FIG. 5, the embodiment of the present disclosure further provides a pixel circuit 500, which comprises: a first light-emitting circuit 502 configured to emit light in a working process; a first drive circuit 504 configured to drive the first light-emitting circuit 502; a first compensating circuit 506 configured to compensate the first drive circuit 504; a first data write circuit 508 configured to write data into the first drive circuit 504; a first reset circuit 510 configured to reset the first drive circuit 504; a first storage circuit 512 configured to store the drive voltage of the first drive circuit 504; a first initializing circuit 514 configured to initialize the first light-emitting circuit 502; a first emission control circuit 516 configured to control the on- and off-state of the first light-emitting circuit 502, for instance, the first emission control circuit 516 includes a first part 516A and a second part 516B; a first power end ELVDD configured to provide a first luminous voltage Velvdd for the first light-emitting circuit 502; a second power end ELVSS configured to provide a second luminous voltage Velvss for the first light-emitting circuit 502; a third power end Vx configured to provide a reset voltage Vvx for the first reset circuit 510; a first data signal end Data1 configured to provide a first data signal or a standby signal for the first data write circuit 508; a first control end Sn−1 configured to provide a first control signal for controlling the on- and off-state of the first reset circuit 510; a second control end Sn configured to provide a second control signal for controlling the on- and off-state of the first data write circuit 508 and the first compensating circuit 506; a third control end Sn+1 configured to provide a third control signal for controlling the on- and off-state of the first initializing circuit 514; and a fourth control end En configured to provide a fourth control signal for controlling the on- and off-state of the first emission control circuit 516.

Figure 6:
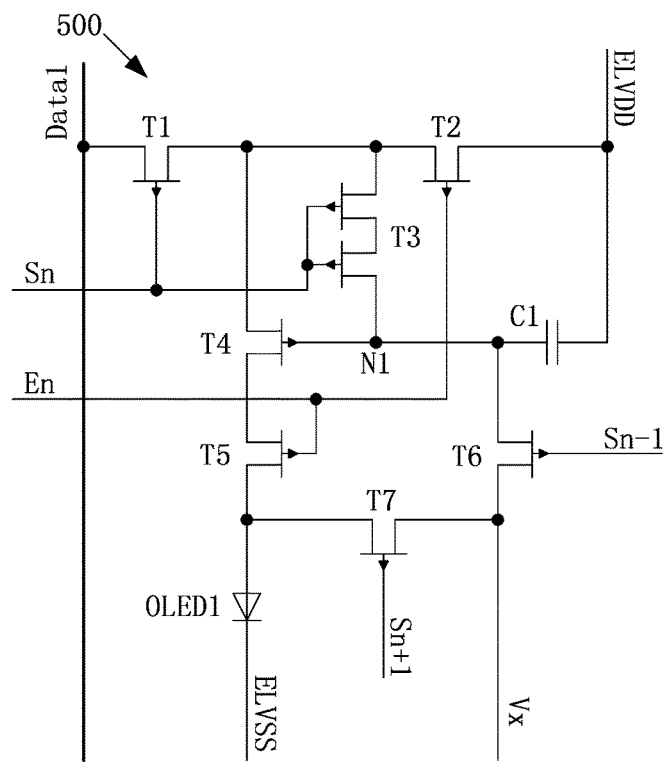
FIG. 6 is a second schematic diagram of the pixel circuit provided by an embodiment of the present disclosure.

For instance, FIG. 6 is a second schematic diagram of the pixel circuit provided by an embodiment of the present disclosure. FIG. 6 is a specific implementation of the pixel circuit as illustrated in FIG. 5. As illustrated in FIGS. 5 and 6, in the pixel circuit 500 provided by an embodiment of the present disclosure, the first data write circuit 508 includes a first transistor T1; the first emission control circuit 516 includes a second transistor T2 and a fifth transistor T5, and for instance, the first part 516A of the first emission control circuit 516 includes the second transistor T2 and the second part 516B of the first emission control circuit 516 includes the fifth transistor T5; the first compensating circuit 506 includes a third transistor T3; the first drive circuit 504 includes a fourth transistor T4; the first reset circuit 510 includes a sixth transistor T6; the first initializing circuit 514 includes a seventh transistor T7; the first storage circuit 512 includes a first storage capacitor C1; and the first light-emitting circuit 502 includes a first organic light-emitting diode OLED1.

For instance, as illustrated in FIG. 6, the third transistor T3 includes a first sub-transistor and a second sub-transistor in series connection; a source electrode of the first sub-transistor is taken as a source electrode of the third transistor T3; a drain electrode of the first sub-transistor is electrically connected with a source electrode of the second sub-transistor; a drain electrode of the second sub-transistor is taken as a drain electrode of the third transistor T3; and a gate electrode of the first sub-transistor and a gate electrode of the second sub-transistor are electrically connected with each other and taken as a gate electrode of the third transistor T3 together. It should be noted that the embodiment of the present disclosure includes but not limited to the composition mode of the third transistor T3, and the third transistor T3 may also only include one transistor or may be a dual-gate transistor.

For instance, as illustrated in FIG. 6, in the pixel circuit 500 provided by an embodiment of the present disclosure, a source electrode of the first transistor T1 is electrically connected with the first data signal end Data1; a gate electrode of the first transistor T1 and a gate electrode of the third transistor T3 are electrically connected with the second control end Sn; a drain electrode of the first transistor T1, a drain electrode of the second transistor T2, a source electrode of the third transistor T3, and a source electrode of the fourth transistor T4 are electrically connected with each other; a gate electrode of the second transistor T2 and a gate electrode of the fifth transistor T5 are electrically connected with the fourth control end En; a source electrode of the second transistor T2 and a first end of the first storage capacitor C1 are electrically connected with the first power end ELVDD; a drain electrode of the third transistor T3 is electrically connected with a first node N1; a gate electrode of the fourth transistor T4 is electrically connected with the first node N1; a drain electrode of the fourth transistor T4 is electrically connected with a source electrode of the fifth transistor T5; a drain electrode of the fifth transistor T5 and a drain electrode of the seventh transistor T7 are electrically connected with a first end of the first organic light-emitting diode OLED1; a source electrode of the sixth transistor T6 and a source electrode of the seventh transistor T7 are electrically connected with the third power end Vx; a gate electrode of the sixth transistor T6 is electrically connected with the first control end Sn−1; a drain electrode of the sixth transistor T6 is electrically connected with the first node N1; a gate electrode of the seventh transistor T7 is electrically connected with the third control end Sn+1; a second end of the first storage capacitor C1 is electrically connected with the first node N1; and a second end of the first organic light-emitting diode OLED1 is electrically connected with the second power end ELVSS.

For instance, the first organic light-emitting diode OLED1 emits blue light or yellow light in the working process.

For instance, in the pixel circuit 500 provided by an embodiment of the present disclosure, the first transistor T1, the second transistor T2, the third transistor T3, the fourth transistor T4, the fifth transistor T5, the sixth transistor T6 and the seventh transistor T7 are all thin film transistors (TFTs).

For instance, in the pixel circuit 500 provided by an embodiment of the present disclosure, the first transistor T1, the second transistor T2, the third transistor T3, the fourth transistor T4, the fifth transistor T5, the sixth transistor T6 and the seventh transistor T7 are all P-type transistors.

It should be noted that the transistors adopted in the embodiment of the present disclosure may all be TFTs, field-effect transistors (FETs) or other switching elements with the same characteristics. The source electrode and the drain electrode of the transistor adopted here may be symmetrical in structure, so the source electrode and the drain electrode of the transistor may have no difference in the physical structure. In the embodiment of the present disclosure, in order to distinguish two electrodes except the gate electrode, one electrode is directly described as the source electrode and the other electrode is described as the drain electrode. The source electrodes and the drain electrodes of all or partial transistors in the embodiment of the present disclosure may be exchangeable as required. In addition, the transistors may be divided into N-type transistors and P-type transistors according to the characteristics of the transistors. Embodiments adopting the N-type transistors can be easily thought of by those skilled in the art without creative efforts on the basis of the description and instruction of the embodiments of the P-type transistors in the present disclosure, so the embodiments shall also fall within the scope of protection of the present disclosure.

The embodiment of the present disclosure further provides a driving method of the pixel circuit as illustrated in FIG. 6. The driving method comprises: a reset period, a compensation period, an initialization period and an emission period. In the reset period, the first control signal Sn−1 outputs a valid signal; the second control end Sn outputs an invalid signal; the third control end Sn+1 outputs an invalid signal; the fourth control end En outputs an invalid signal; and the first data signal end Data1 outputs a standby signal. In the compensation period, the first control signal Sn−1 outputs an invalid signal; the second control end Sn outputs a valid signal; the third control end Sn+1 outputs an invalid signal; the fourth control end En outputs an invalid signal; and the first data signal end Data1 outputs a first data signal. In the initialization period, the first control signal Sn−1 outputs an invalid signal; the second control end Sn outputs an invalid signal; the third control end Sn+1 outputs a valid signal; the fourth control end En outputs an invalid signal; and the first data signal end Data1 outputs a first data signal. In the emission period, the first control signal Sn−1 outputs an invalid signal; the second control end Sn outputs an invalid signal; the third control end Sn+1 outputs an invalid signal; the fourth control end En outputs a valid signal; and the first data signal end Data1 outputs a first data signal.

For instance, the driving method provided by an embodiment of the present disclosure may further comprise: a pre-reset period and a pre-emission period. The pre-reset period is after the emission period and before the reset period, and the pre-emission period is after the initialization period and before the emission period. In the pre-reset period, the first control signal Sn−1 outputs an invalid signal; the second control end Sn outputs an invalid signal; the third control end Sn+1 outputs an invalid signal; the fourth control end En outputs an invalid signal; and the first data signal end Data1 outputs a standby signal. In the pre-emission period, the first control signal Sn−1 outputs an invalid signal; the second control end Sn outputs an invalid signal; the third control end Sn+1 outputs an invalid signal; the fourth control end En outputs an invalid signal; and the first data signal end Data1 outputs a first data signal.

It should be noted that: the valid signal (or enabling signal) described in the embodiments of the present disclosure refers to a signal capable of switching on the corresponding circuit or transistor; the invalid signal refers to a signal capable of switching off the corresponding circuit or transistor; the first data signal refers to a signal (e.g., a low level signal) including luminous brightness information of the first light-emitting circuit or the first OLED; and the standby signal refers to a signal (e.g., a high level signal) capable of disabling the emission of the first light-emitting circuit or the first OLED. For instance, when the transistor is a P-type transistor, the valid signal refers to a low level signal; the invalid signal refers to a high level signal; and the specific voltage of the low level signal and the high level signal may be correspondingly set according to the properties of the transistors. Description will be given below by taking the case that the first transistor T1, the second transistor T2, the third transistor T3, the fourth transistor T4, the fifth transistor, the sixth transistor T6 and the seventh transistor T7 are all P-type transistors as an example.

Figure 7:
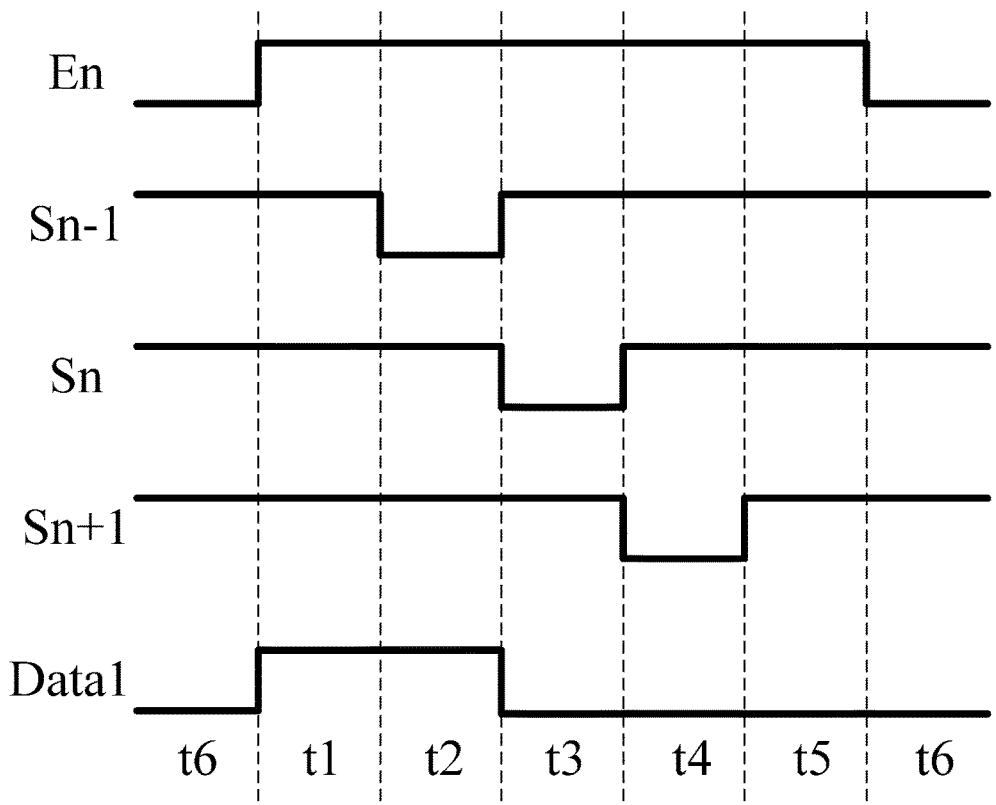
FIG. 7 is a drive timing diagram of the pixel circuit as illustrated in FIG. 6 provided by an embodiment of the present disclosure.

For instance, FIG. 7 is a drive timing diagram of the pixel circuit as illustrated in FIG. 6 provided by an embodiment of the present disclosure. The embodiment of the present disclosure further provides a driving method of the pixel circuit as illustrated in FIG. 6, which comprises: a pre-reset period t1, a reset period t2, a compensation period t3, an initialization period t4, a pre-emission period t5 and an emission period t6.

For instance, in the pre-reset period t1, the first control end Sn−1 outputs a high level signal; the second control end Sn outputs a high level signal; the third control end Sn+1 outputs a high level signal; the fourth control end En outputs a high level signal; and the first data signal end Data1 outputs a high level signal.

Figure 8A:
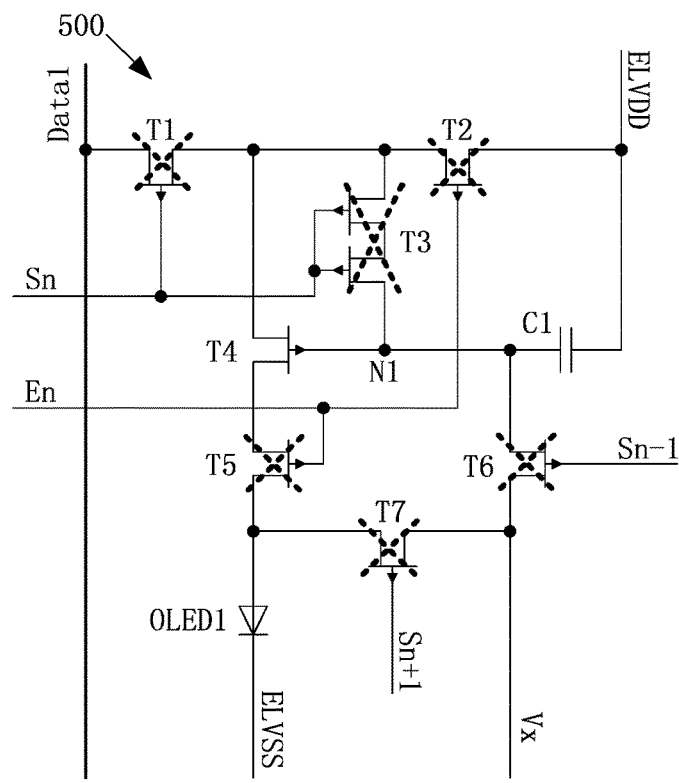
FIG. 8A is a schematic diagram illustrating the conducting state in a pre-reset period when the pixel circuit as illustrated in FIG. 6 provided by an embodiment of the present disclosure is driven by the drive timing as illustrated in FIG. 7.

For instance, FIG. 8A is a schematic diagram illustrating the conducting state in the pre-reset period t1 when the pixel circuit as illustrated in FIG. 6 provided by an embodiment of the present disclosure is driven by the drive timing as illustrated in FIG. 7. In the pre-reset period t1, the first transistor T1, the second transistor T2, the third transistor T3, the fifth transistor T5, the sixth transistor T6 and the seventh transistor T7 are all in the off-state, and no electrical current path is formed in the pixel circuit; and the conducting state of the fourth transistor T4 is relevant to the voltage of the first node N1. For instance, the pre-reset period may provide a stable time period for the pixel circuit, obtain stable voltage and current states of circuit elements, and hence avoid circuit abnormalities.

For instance, in the reset period t2, the first control end Sn−1 outputs a low level signal; the second control end Sn outputs a high level signal; the third control end Sn+1 outputs a high level signal; the fourth control end En outputs a high level signal; and the first data signal end Data1 outputs a high level signal.

Figure 8B:
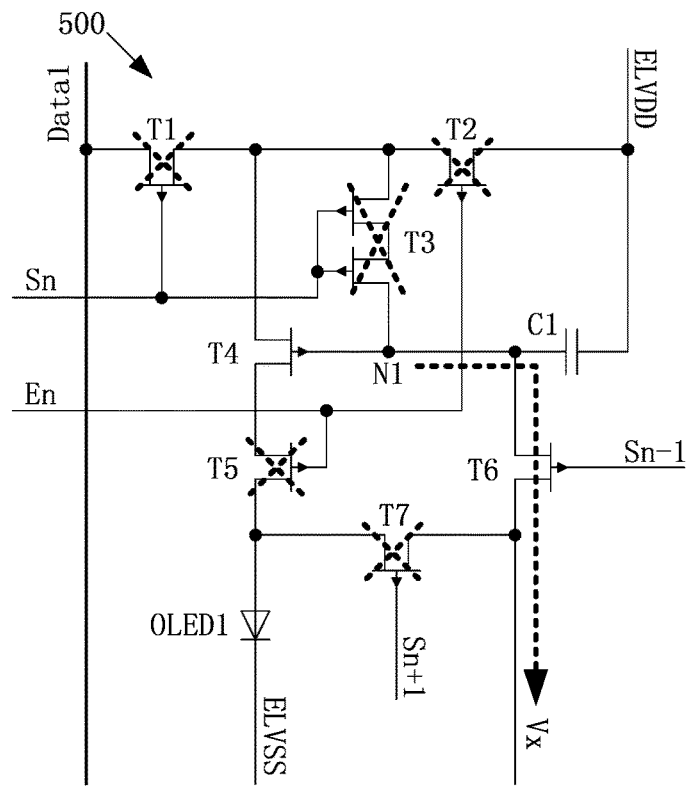
FIG. 8B is a schematic diagram illustrating the conducting state in a reset period when the pixel circuit as illustrated in FIG. 6 provided by an embodiment of the present disclosure is driven by the drive timing as illustrated in FIG. 7.

FIG. 8B is a schematic diagram illustrating the conducting state in the reset period t2 when the pixel circuit as illustrated in FIG. 6 provided by an embodiment of the present disclosure is driven by the drive timing as illustrated in FIG. 7. In the reset period t2, the first transistor T1, the second transistor T2, the third transistor T3, the fifth transistor T5 and the seventh transistor T7 are all in the off-state; as the first control end Sn−1 outputs the low level signal, the sixth transistor T6 is switched on; the voltage of the first node N1 is the reset voltage Vvx provided by the third power end Vx; the reset voltage Vvx is, for instance, a low level voltage capable of switching on the P-type transistor; moreover, for instance, the reset voltage Vvx is a negative voltage; and at this point, as the voltage of the first node N1 is the low level reset voltage Vvx, the fourth transistor T4 is switched on, but no electrical current path will be formed. Thus, the fourth transistor T4 can be reset through the sixth transistor T6, namely the first drive circuit is reset through the first reset circuit. For instance, after the reset period, the voltage difference between the first node N1 and the first data signal Vdata1 is increased, and the charging time on the first storage capacitor C1 in the compensation period t3 is reduced.

For instance, in the compensation period t3, the first control end Sn−1 outputs a high level signal; the second control end Sn outputs a low level signal; the third control end Sn+1 outputs a high level signal; the fourth control end En outputs a high level signal; and the first data signal end Data1 outputs a first data signal Vdata1 (e.g., a low level signal).

Figure 8C:
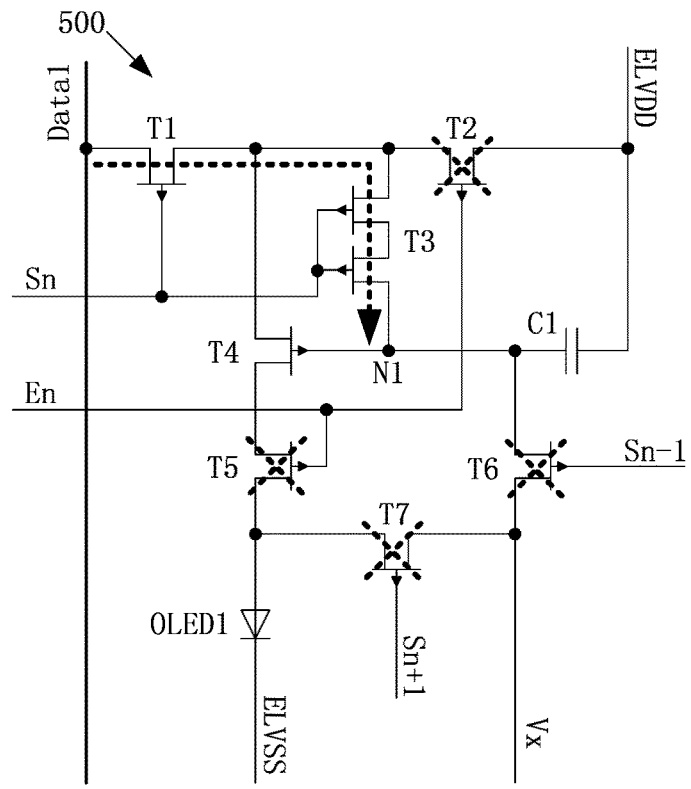
FIG. 8C is a schematic diagram illustrating the conducting state in a compensation period when the pixel circuit as illustrated in FIG. 6 provided by an embodiment of the present disclosure is driven by the drive timing as illustrated in FIG. 7.

FIG. 8C is a schematic diagram illustrating the conducting state in the compensation period t3 when the pixel circuit as illustrated in FIG. 6 provided by an embodiment of the present disclosure is driven by the drive timing as illustrated in FIG. 7. In the compensation period t3, the second transistor T2, the fifth transistor T5, the sixth transistor T6 and the seventh transistor T7 are all in the off-state; as the second control end Sn outputs the low level signal, the first transistor T1 and the third transistor T3 are switched on; the first data signal Vdata1 outputted by the first data signal end Data1 is transmitted to the first node N1 through the first transistor T1 and the third transistor T3; after the first storage capacitor C1 is charged, the voltage of the first node N1 is Vdata1+Vth1 (Vth1 refers to the overall IR-drop of the first transistor T1 and the third transistor T3), that is, the first data write circuit writes data into the first drive circuit, and the first compensation circuit compensates the first drive circuit; and at this point, the fourth transistor T4 is switched on, but no electrical current path will be formed.

For instance, in the initialization period t4, the first control end Sn−1 outputs a high level signal; the second control end Sn outputs a high level signal; the third control end Sn+1 outputs a low level signal; the fourth control end En outputs a high level signal; and the first data signal end Data1 outputs a first data signal Vdata1.

Figure 8D:
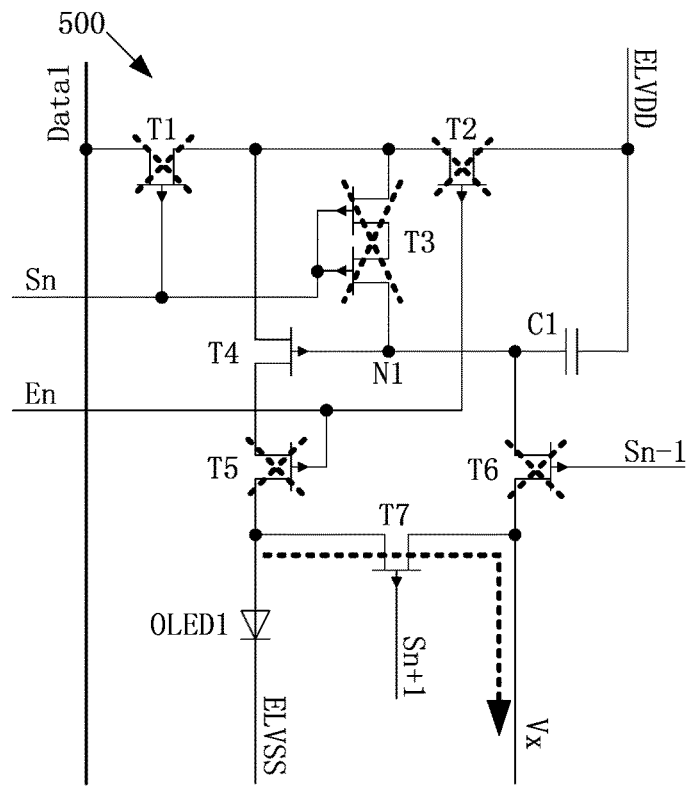
FIG. 8D is a schematic diagram illustrating the conducting state in an initialization period when the pixel circuit as illustrated in FIG. 6 provided by an embodiment of the present disclosure is driven by the drive timing as illustrated in FIG. 7.

FIG. 8D is a schematic diagram illustrating the conducting state in the initialization period when the pixel circuit as illustrated in FIG. 6 provided by an embodiment of the present disclosure is driven by the drive timing as illustrated in FIG. 7. In the initialization period t4, the first transistor T1, the second transistor T2, the third transistor T3, the fifth transistor T5 and the sixth transistor T6 are all in the off-state; due to the storage voltage function of the first storage capacitor C1, the fourth transistor T4 is kept in the same on-state as that in the compensation period t3; as the third control end Sn+1 outputs the low level signal, the seventh transistor T7 is switched on; and the reset voltage Vvx provided by the third power end Vx is transmitted to the first end (the first end is, for instance, an anode) of the first organic light-emitting diode OLED1 through the seventh transistor T7, namely the fourth light-emitting circuit is initialized by the fourth initializing circuit. For instance, the reset voltage Vvx is less than or equal to the second luminous voltage Velvss provided by the second power end ELVSS, so as to avoid the abnormal emission of the OLED by initialization, for instance, avoid the slight emission of the OLED in the non-emission period. For instance, the OLED is subjected to initializing discharge in the driving process, so as to ensure the accuracy at a low gray scale and full black under full-dark-state images and effectively improve the contrast of the entire display panel.

For instance, in the pre-emission period t5, the first control end Sn−1 outputs a high level signal; the second control end Sn outputs a high level signal; the third control end Sn+1 outputs a high level signal; the fourth control end En outputs a high level signal; and the first data signal end Data1 outputs a first data signal Vdata1.

Figure 8E:
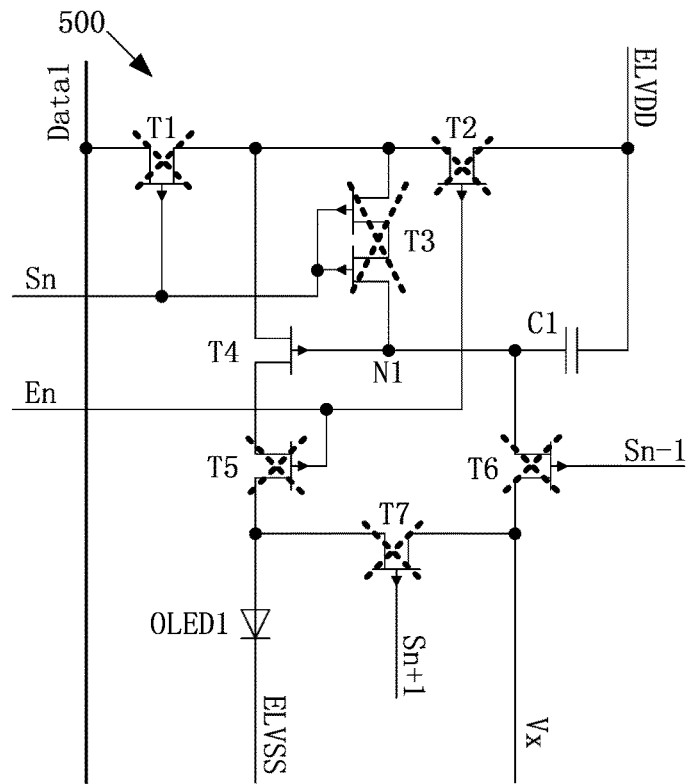

FIG. 8E is a schematic diagram illustrating the conducting state in the pre-emission period t5 when the pixel circuit as illustrated in FIG. 6 provided by an embodiment of the present disclosure is driven by the drive timing as illustrated in FIG. 7. In the pre-emission period t5, the first transistor T1, the second transistor T2, the third transistor T3, the fifth transistor T5, the sixth transistor T6, and the seventh transistor T7 are all in the off-state, and no electrical current path is formed in the pixel circuit; and due to the storage voltage function of the first storage capacitor C1, the fourth transistor T4 is kept in the same on-state as that in the initialization period t4. For instance, the pre-emission period may provide a stable time period for the pixel circuit, obtain stable voltage and current states of circuit elements, and hence avoid circuit abnormalities.

For instance, in the emission period t6, the first control end Sn−1 outputs a high level signal; the second control end Sn outputs a high level signal; the third control end Sn+1 outputs a high level signal; the fourth control end En outputs a low level signal; and the first data signal end Data1 outputs a first data signal Vdata1.

Figure 8F:
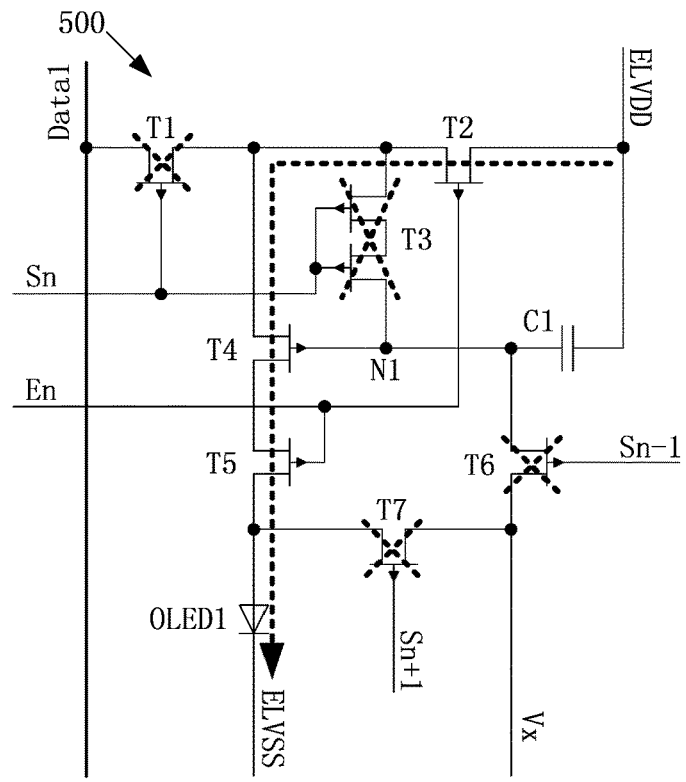
FIG. 8F is a schematic diagram illustrating the conducting state in an emission period when the pixel circuit as illustrated in FIG. 6 provided by an embodiment of the present disclosure is driven by the drive timing as illustrated in FIG. 7.

FIG. 8F is a schematic diagram illustrating the conducting state in the emission period t6 when the pixel circuit as illustrated in FIG. 6 provided by an embodiment of the present disclosure is driven by the drive timing as illustrated in FIG. 7. In the emission period t6, the first transistor T1, the third transistor T3, the sixth transistor T6 and the seventh transistor T7 are all in the off-state; due to the storage voltage function of the first storage capacitor C1, the fourth transistor T4 is kept in the same on-state as that in the pre-emission period t5; as the fourth control end En outputs the low level signal, the second transistor T2 and the fifth transistor T5 are in the on-state; an electrical current path is formed by the first power end ELVDD, the second transistor T2, the fourth transistor T4, the fifth transistor T5, the first organic light-emitting diode OLED1 and the second power end ELVSS; and the first organic light-emitting diode OLED1 is driven by the fourth transistor T4 to emit light under the action of the first luminous voltage Velvdd provided by the first power end ELVDD and the second luminous voltage Velvss provided by the second power end ELVSS. That is to say, the first emission control circuit controls the operation of the first light-emitting circuit; the first power end provides the first luminous voltage to the first light-emitting circuit; the second power end provides the second luminous voltage to the first light-emitting circuit; the first drive circuit drives the first light-emitting circuit; and the first light-emitting circuit emits light in the working process.

It should be noted that the driving method of the pixel circuit as illustrated in FIG. 6 may only include the reset period t2, the compensation period t3, the initialization period t4 and the emission period t6 and does not include the pre-reset period t1 and the pre-emission period t5, or includes one of the pre-reset period t1 and the pre-emission period t5. No limitation is given here.

Figure 9:
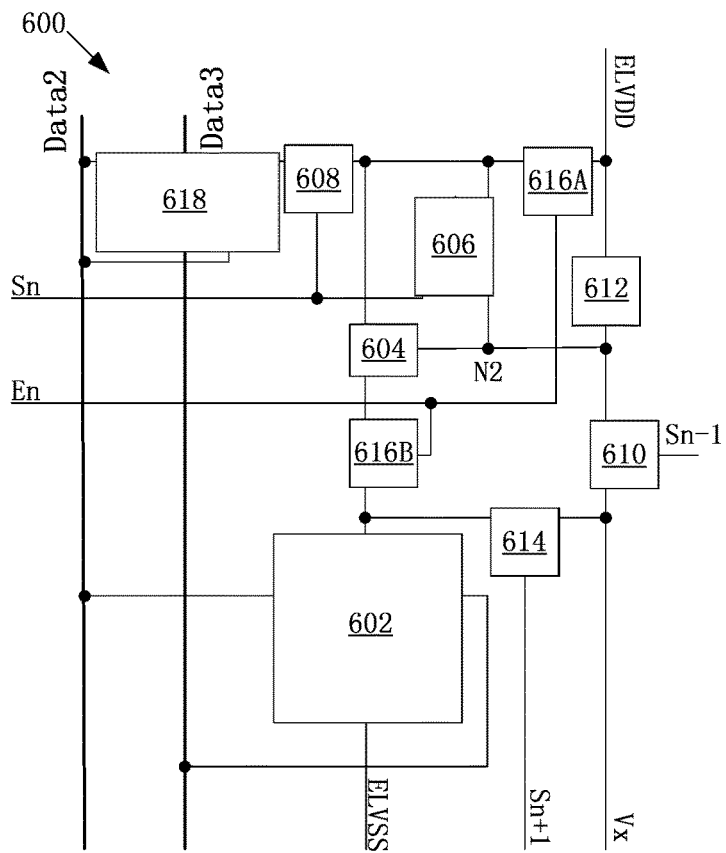
FIG. 9 is a first schematic diagram of still another pixel circuit provided by an embodiment of the present disclosure.

For instance, FIG. 9 is a first schematic diagram of still another pixel circuit provided by an embodiment of the present disclosure. As illustrated in FIG. 9, the embodiment of the present disclosure further provides a pixel circuit 600, which comprises: a second light-emitting circuit 602 configured to emit light in a working process; a second drive circuit 604 configured to drive the second light-emitting circuit 602; a second compensating circuit 606 configured to compensate the second drive circuit 604; a second data write circuit 608 configured to write data into the second drive circuit 604; a second reset circuit 610 configured to reset the second drive circuit 604; a second storage circuit 612 configured to store the drive voltage of the second drive circuit 604; a second initializing circuit 614 configured to initialize the second light-emitting circuit 602; a second emission control circuit 616 configured to control the on- and off-state of the second light-emitting circuit 602, for instance, the second emission control circuit 616 includes a first part 616A and a second part 616B; an election circuit 618 configured to transmit a second data signal or a third data signal to the second data write circuit 608; a first power end ELVDD configured to provide a first luminous voltage Velvdd for the second light-emitting circuit 602; a second power end ELVSS configured to provide a second luminous voltage Velvss for the second light-emitting circuit 602; a third power end Vx configured to provide a reset voltage Vvx for the second reset circuit 610; a second data signal end Data2 configured to provide the second data signal or a standby signal for the second data write circuit 608; a third data signal end Data3 configured to provide the third data signal or a standby signal for the second data write circuit 608; a first control end Sn−1 configured to provide a first control signal for controlling the on- and off-state of the second reset circuit 610; a second control end Sn configured to provide a second control signal for controlling the on- and off-state of the second data write circuit 608 and the second compensating circuit 606; a third control end Sn+1 configured to provide a third control signal for controlling the on- and off-state of the second initializing circuit 614; and a fourth control end En configured to provide a fourth control signal for controlling the on- and off-state of the second emission control circuit 616.

Figure 10:
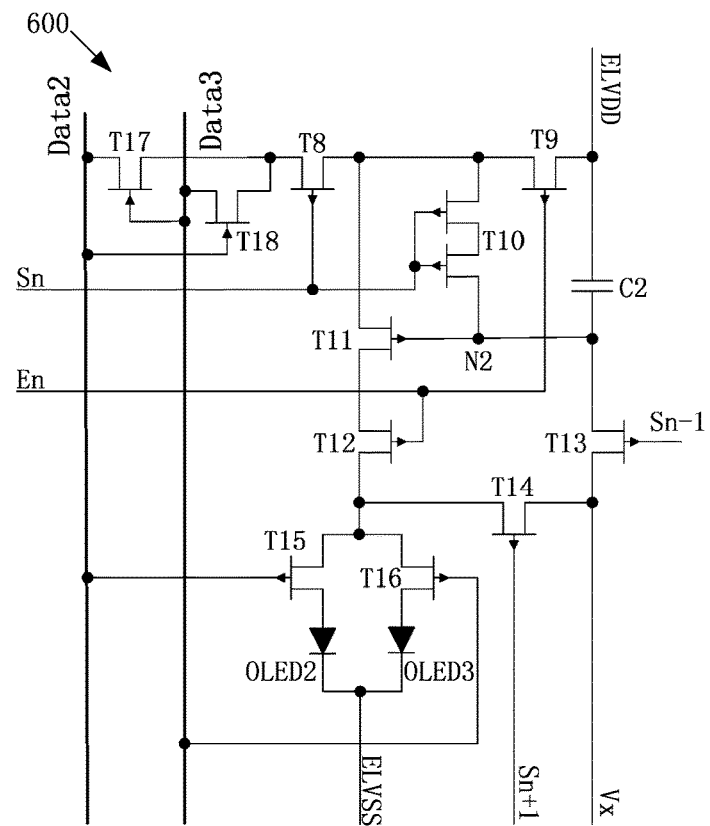
FIG. 10 is a second schematic diagram of still another pixel circuit provided by an embodiment of the present disclosure.

For instance, FIG. 10 is a second schematic diagram of still another pixel circuit provided by an embodiment of the present disclosure. FIG. 10 is a specific implementation of the pixel circuit as illustrated in FIG. 9. As illustrated in FIGS. 9 and 10, in the pixel circuit 600 provided by an embodiment of the present disclosure, the second data write circuit 608 includes an eighth transistor T8; the second emission control circuit 616 includes a ninth transistor T9 and a twelfth transistor T12, for instance, the first part 616A of the second emission control circuit 616 includes the ninth transistor T9 and the second part 616B of the second emission control circuit 616 includes the twelfth transistor T12; the second compensating circuit 606 includes a tenth transistor T10; the second drive circuit 604 includes an eleventh transistor T11; the second reset circuit 610 includes a thirteenth transistor T13; the second initializing circuit 614 includes a fourteenth transistor T14; the second storage circuit 612 includes a second storage capacitor C2; the second light-emitting circuit 602 includes a second organic light-emitting diode OLED2, a third organic light-emitting diode OLED3, a fifteenth transistor T15 and a sixteenth transistor T16; and the election circuit 618 includes a seventeenth transistor T17 and an eighteenth transistor T18.

For instance, as illustrated in FIG. 10, the tenth transistor T10 includes a third sub-transistor and a fourth sub-transistor; a source electrode of the third sub-transistor is taken as a source electrode of the tenth transistor T10; a drain electrode of the third sub-transistor is electrically connected with a source electrode of the fourth sub-transistor; a drain electrode of the fourth sub-transistor is taken as a drain electrode of the tenth transistor T10; and a gate electrode of the third sub-transistor and a gate electrode of the fourth sub-transistor are electrically connected with each other and taken as a gate electrode of the tenth transistor T10. It should be noted that the embodiment of the present disclosure includes but not limited to the composition mode of the tenth transistor T10, and the tenth transistor T10 may also only include one transistor, or, for instance, is a dual-gate transistor.

For instance, as illustrated in FIG. 10, in the pixel circuit 600 provided by an embodiment of the present disclosure, a source electrode of the eighth transistor T8, a drain electrode of the seventeenth transistor T17, and a drain electrode of the eighteenth transistor T18 are electrically connected with each other; a gate electrode of the eighth transistor T8 and a gate electrode of the tenth transistor T10 are electrically connected with the second control end Sn; a drain electrode of the eighth transistor T8, a drain electrode of the ninth transistor T9, a source electrode of the tenth transistor T10, and a source electrode of the eleventh transistor T11 are electrically connected with each other; a gate electrode of the ninth transistor T9 and a gate electrode of the twelfth transistor T12 are electrically connected with the fourth control end En; a source electrode of the ninth transistor T9 and a first end of the second storage capacitor C2 are electrically connected with the first power end ELVDD; a drain electrode of the tenth transistor T10 is electrically connected with a second node N2; a gate electrode of the eleventh transistor T11 is electrically connected with the second node N2; a drain electrode of the eleventh transistor T11 is electrically connected with a source electrode of the twelfth transistor T12; a drain electrode of the twelfth transistor T12, a drain electrode of the fourteenth transistor T14, a source electrode of the fifteenth transistor T15, and a source electrode of the sixteenth transistor T16 are electrically connected with a third node; a source electrode of the thirteenth transistor T13 and a source electrode of the fourteenth transistor T14 are electrically connected with the third power end Vx; a gate electrode of the thirteenth transistor T13 is electrically connected with the first control end Sn−1; a drain electrode of the thirteenth transistor T13 is electrically connected with the second node N2; a gate electrode of the fourteenth transistor T14 is electrically connected with the third control end Sn+1; a gate electrode of the fifteenth transistor T15 is electrically connected with the second data signal end Data2; a drain electrode of the fifteenth transistor T15 is electrically connected with a first end of the second organic light-emitting diode OLED2; a gate electrode of the sixteenth transistor T16 is electrically connected with the third data signal end Data3; a drain electrode of the sixteenth transistor T16 is electrically connected with a first end of the third organic light-emitting diode OLED3; a source electrode of the seventeenth transistor T17 is electrically connected with the second data signal end Data2; a gate electrode of the seventeenth transistor T17 is electrically connected with the third data signal end Data3; a source electrode of the eighteenth transistor T18 is electrically connected with the third data signal end Data3; a gate electrode of the eighteenth transistor T18 is electrically connected with the second data signal end Data2; a second end of the second storage capacitor C2 is electrically connected with the second node N2; and a second end of the second organic light-emitting diode OLED2 and a second end of the third organic light-emitting diode OLED3 are electrically connected with the second power end ELVSS.

For instance, in the pixel circuit 600 provided by an embodiment of the present disclosure, the eighth transistor T8, the ninth transistor T9, the tenth transistor T10, the eleventh transistor T11, the twelfth transistor T12, the thirteenth transistor T13, the fourteenth transistor T14, the fifteenth transistor T15, the sixteenth transistor T16, the seventeenth transistor T17 and the eighteenth transistor T18 are all TFTs.

For instance, in the pixel circuit 600 provided by an embodiment of the present disclosure, the eighth transistor T8, the ninth transistor T9, the tenth transistor T10, the eleventh transistor T11, the twelfth transistor T12, the thirteenth transistor T13, the fourteenth transistor T14, the fifteenth transistor T15, the sixteenth transistor T16, the seventeenth transistor T17 and the eighteenth transistor T18 are all N-type transistors.

For instance, the pixel circuit 600 simultaneously controls the second organic light-emitting diode OLED2 and the third organic light-emitting diode OLED3, and hence reduces the number of the pixel circuits on the whole, reduces the occupied area of the pixel circuit, and improves the resolution of the display panel.

For instance, in the working process of the pixel circuit 600, the second organic light-emitting diode OLED2 may emit light independently, or the third OLED OLDS may emit light independently.

An embodiment of the present disclosure further provides a driving method of the pixel circuit as illustrated in FIG. 10. The driving method comprises: a reset period, a compensation period, an initialization period and an emission period. In the reset period, the first control end Sn−1 outputs a valid signal; the second control end Sn outputs an invalid signal; the third control end Sn+1 outputs an invalid signal; the fourth control end En outputs an invalid signal; the second data signal end Data2 outputs a standby signal; and the third data signal end Data3 outputs a standby signal. In the compensation period, the first control end Sn−1 outputs an invalid signal; the second control end Sn outputs a valid signal; the third control end Sn+1 outputs an invalid signal; the fourth control end En outputs an invalid signal; the second data signal end Data2 outputs a second data signal; and the third data signal end Data3 outputs a standby signal. In the initialization period, the first control end Sn−1 outputs an invalid signal; the second control end Sn outputs an invalid signal; the third control end Sn+1 outputs a valid signal; the fourth control end En outputs an invalid signal; the second data signal end Data2 outputs a second data signal; and the third data signal end Data3 outputs a standby signal. In the emission period, the first control end Sn−1 outputs an invalid signal; the second control end Sn outputs an invalid signal; the third control end Sn+1 outputs an invalid signal; the fourth control end En outputs a valid signal; the second data signal end Data2 outputs a second data signal; and the third data signal end Data3 outputs a standby signal. In this case, the second organic light-emitting diode OLED2 emits light independently.

Or in the reset period, the first control end Sn−1 outputs a valid signal; the second control end Sn outputs an invalid signal; the third control end Sn+1 outputs an invalid signal; the fourth control end En outputs an invalid signal; the second data signal end Data2 outputs a standby signal; and the third data signal end Data3 outputs a standby signal. In the compensation period, the first control end Sn−1 outputs an invalid signal; the second control end Sn outputs a valid signal; the third control end Sn+1 outputs an invalid signal; the fourth control end En outputs an invalid signal; the second data signal end Data2 outputs a standby signal; and the third data signal end Data3 outputs a third data signal. In the initialization period, the first control end Sn−1 outputs an invalid signal; the second control end Sn outputs an invalid signal; the third control end Sn+1 outputs a valid signal; the fourth control end En outputs an invalid signal; the second data signal end Data2 outputs a standby signal; and the third data signal end Data3 outputs a third data signal. In the emission period, the first control end Sn−1 outputs an invalid signal; the second control end Sn outputs an invalid signal; the third control end Sn+1 outputs an invalid signal; the fourth control end En outputs a valid signal; the second data signal end Data2 outputs a standby signal; and the third data signal end Data3 outputs a third data signal. In this case, the third organic light-emitting diode OLED3 emits light independently.

For instance, the driving method provided by an embodiment of the present disclosure may further comprise: a pre-reset period and a pre-emission period. The pre-reset period is after the emission period and before the reset period, and the pre-emission period is after the initialization period and before the emission period. In the pre-reset period, the first control end Sn−1 outputs an invalid signal; the second control end Sn outputs an invalid signal; the third control end Sn+1 outputs an invalid signal; the fourth control end En outputs an invalid signal; the second data signal end Data2 outputs a standby signal; and the third data signal end Data3 outputs a standby signal. In the pre-emission period, the first control end Sn−1 outputs an invalid signal; the second control end Sn outputs an invalid signal; the third control end Sn+1 outputs an invalid signal; the fourth control end En outputs an invalid signal; the second data signal end Data2 outputs a second data signal, and the third data signal end Data3 outputs a standby signal; or the second data signal end Data2 outputs a standby signal, and the third data signal end Data3 outputs a third data signal.

For instance, in the driving method provided by an embodiment of the present disclosure, in the compensation period, the initialization period, the pre-emission period and the emission period, when the second data signal end Data2 outputs the second data signal and the third data signal end Data3 outputs the standby signal, the second organic light-emitting diode OLED2 emits light independently, and the second data signal is provided to control the luminous brightness of the second organic light-emitting diode OLED2; and when the second data signal end Data2 outputs the standby signal and the third data signal end Data3 outputs the third data signal, the third organic light-emitting diode OLED3 emits light independently, and the third data signal is provided to control the luminous brightness of the third organic light-emitting diode OLED3.

For instance, the second organic light-emitting diode OLED2 emits red light in the working process, and the third organic light-emitting diode OLED3 emits green light in the working process.

It should be noted that: in the embodiment of the present disclosure, a valid signal refers to a signal capable of switching on a corresponding circuit or transistor; the invalid signal refers to a signal capable of switching off a corresponding circuit or transistor; the first data signal and the second data signal refer to a signal (e.g., a low level signal) including luminous brightness information of a corresponding light-emitting circuit or OLED; and the standby signal refers to a signal (e.g., a high level signal) capable of disabling the emission of a corresponding light-emitting circuit or OLED. For instance, when the transistor is a P-type transistor, the valid signal refers to a low level signal; the invalid signal refers to a high level signal; and the specific voltage of the low level signal and the high level signal may be correspondingly set according to the properties of the transistor. Description will be given below by taking the following as an example: the eighth transistor T8, the ninth transistor T9, the tenth transistor T10, the eleventh transistor T11, the twelfth transistor T12, the thirteenth transistor T13, the fourth transistor T14, the fifteenth transistor T15 and the sixteenth transistor T16 are all P-type transistors; both the seventeenth transistor T17 and the eighteenth transistor T18 are N-type transistors; and the second OLED emits light independently.

Figure 11:
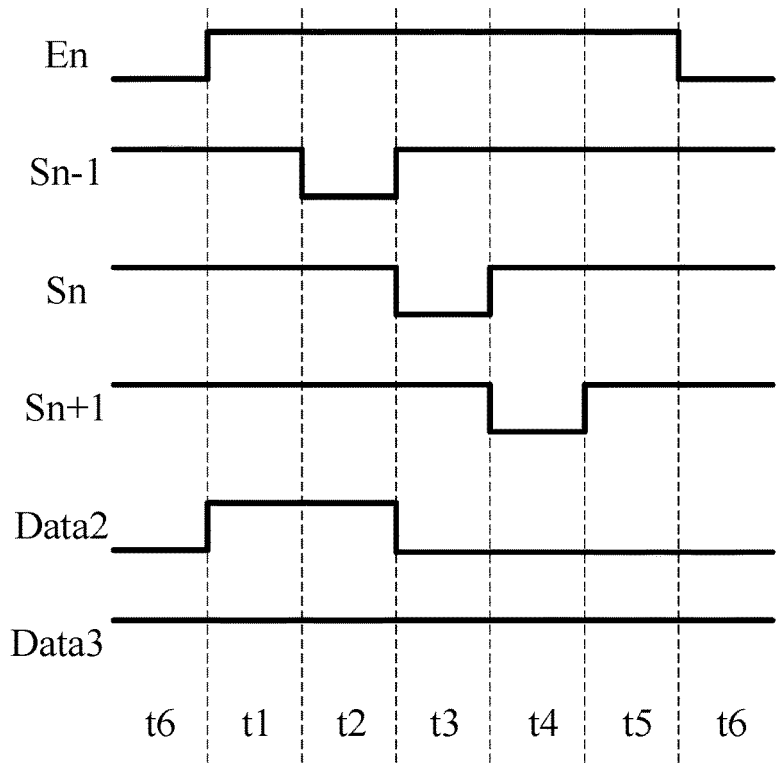
FIG. 11 is a drive timing diagram when a second OLED, in the pixel circuit as illustrated in FIG. 10 provided by an embodiment of the present disclosure, emits light independently.

For instance, FIG. 11 is a drive timing diagram of the pixel circuit as illustrated in FIG. 10 provided by an embodiment of the present disclosure. The embodiment of the present disclosure further provides a driving method of the pixel circuit as illustrated in FIG. 10, which comprises: a pre-reset period t1, a reset period t2, a compensation period t3, an initialization period t4, a pre-emission period t5, and an emission period t6.

For instance, in the pre-reset period t1, the first control end Sn−1 outputs a high level signal; the second control end Sn outputs a high level signal; the third control end Sn+1 outputs a high level signal; the fourth control end En outputs a high level signal; the second data signal end Data2 outputs a high level signal; and the third data signal end Data3 outputs a high level signal.

Figure 12A:
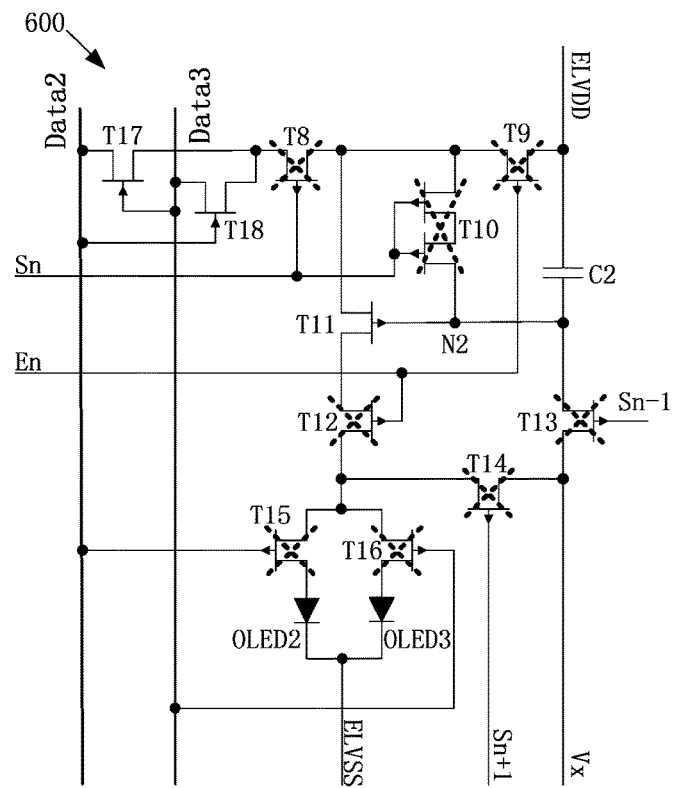
FIG. 12A is a schematic diagram illustrating the conducting state in a pre-reset period when the pixel circuit as illustrated in FIG. 10 provided by an embodiment of the present disclosure is driven by the drive timing as illustrated in FIG. 11.

For instance, FIG. 12A is a schematic diagram illustrating the conducting state when the pixel circuit as illustrated in FIG. 10 provided by an embodiment of the present disclosure is driven by the drive timing as illustrated in FIG. 11. In the pre-reset period t1, the eighth transistor T8, the ninth transistor T9, the tenth transistor T10, the twelfth transistor T12, the thirteenth transistor T13, the fourteenth transistor T14, the fifteenth transistor T15 and the sixteenth transistor T16 are all in the off-state; the seventeenth transistor T17 (N-type transistor) and the eighteenth transistor T18 (N-type transistor) are switched on; and the conducting state of the eleventh transistor T11 is relevant to the voltage of the second node N2. For instance, the pre-reset period may provide a stable time period for the pixel circuit, obtain stable voltage and current states of circuit elements, and hence avoid circuit abnormalities.

For instance, in the reset period t2, the first control end Sn−1 outputs a low level signal; the second control end Sn outputs a high level signal; the third control end Sn+1 outputs a high level signal; the fourth control end En outputs a high level signal; the second data signal end Data2 outputs a high level signal; and the third data signal end Data3 outputs a high level signal.

Figure 12B:
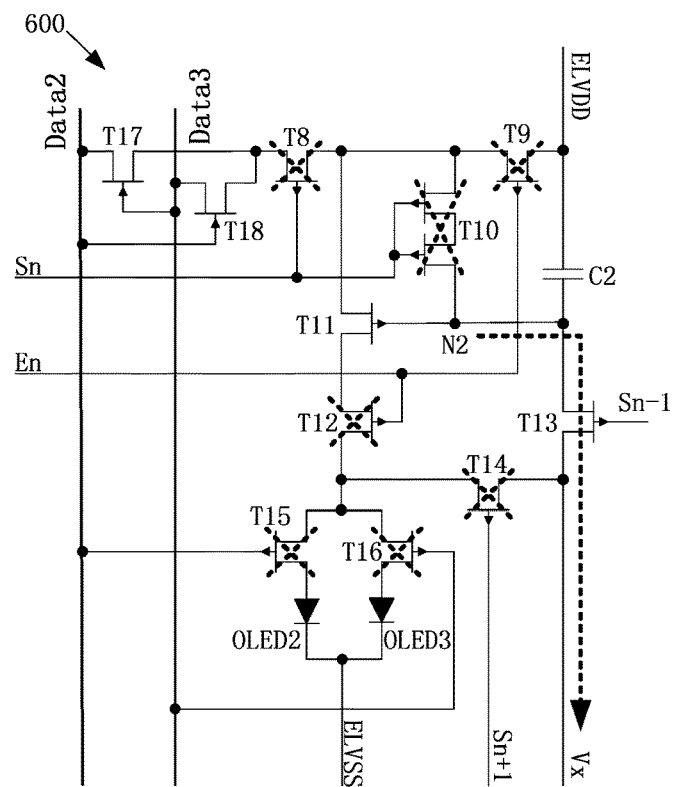
FIG. 12B is a schematic diagram illustrating the conducting state in a reset period when the pixel circuit as illustrated in FIG. 10 provided by an embodiment of the present disclosure is driven by the drive timing as illustrated in FIG. 11.

FIG. 12B is a schematic diagram illustrating the conducting state when the pixel circuit as illustrated in FIG. 10 provided by an embodiment of the present disclosure is driven by the drive timing as illustrated in FIG. 11. In the reset period t2, the eighth transistor T8, the ninth transistor T9, the tenth transistor T10, the twelfth transistor T12, the fourteenth transistor T14, the fifteenth transistor T15 and the sixteenth transistor T16 are all in the off-state; the seventeenth transistor T17 and the eighteenth transistor T18 are switched on; as the first control end Sn−1 outputs the low level signal, the thirteenth transistor T13 is switched on; the voltage of the second node N2 is the reset voltage Vvx provided by the third power end Vx; the reset voltage Vvx is, for instance, a low level voltage capable of switching on the P-type transistor; moreover, for instance, the reset voltage Vvx is a negative voltage; and at this point, as the voltage of the second node N2 is the low level reset voltage Vvx, the eleventh transistor T11 is switched on, but no electrical current path will be formed. Thus, the eleventh transistor T11 is reset through the thirteenth transistor T13, namely the second drive circuit is reset by the second reset circuit. For instance, after the reset period, the voltage difference between the second node N2 and the second data signal Vdata2 is increased, and the charging time on the second storage capacitor C2 in the compensation period t3 is reduced.

For instance, in the compensation period t3, the first control end Sn−1 outputs a high level signal; the second control end Sn outputs a low level signal; the third control end Sn+1 outputs a high level signal; the fourth control end En outputs a high level signal; the second data signal end Data2 outputs a second data signal Vdata2 (e.g., a low level signal); and the third data signal end Data3 outputs a high level signal.

Figure 12C:
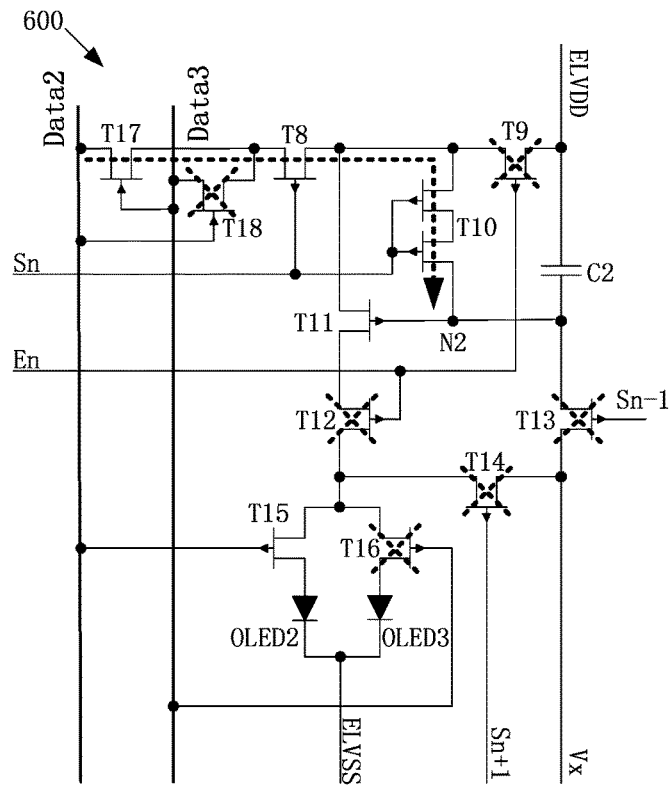
FIG. 12C is a schematic diagram illustrating the conducting state in a compensation period when the pixel circuit as illustrated in FIG. 10 provided by an embodiment of the present disclosure is driven by the drive timing as illustrated in FIG. 11.

FIG. 12C is a schematic diagram illustrating the conducting state in the compensation period t3 when the pixel circuit as illustrated in FIG. 10 provided by an embodiment of the present disclosure is driven by the drive timing as illustrated in FIG. 11. In the compensation period t3, the ninth transistor T9, the twelfth transistor T12, the thirteenth transistor T13, the fourteenth transistor T14, the sixteenth transistor T16 and the eighteenth transistor T18 are all in the off-state; as the second data signal end Data2 outputs the second data signal Vdata2 (e.g., low level signal), the fifteenth transistor T15 is switched on; as the third data signal Data3 outputs the high level signal, the seventeenth transistor T17 is switched on; and as the second control end Sn outputs the low level signal, the eighth transistor T8 and the tenth transistor T10 are switched on. The second data signal Vdata2 outputted by the second data signal end Data2 is transmitted to the second node N2 through the seventeenth transistor T17, the eighth transistor T8 and the tenth transistor T10. After the second storage capacitor C2 is charged, the voltage of the second node N2 is Vdata1+Vth2 (Vth2 is the overall IR-drop of the seventeenth transistor T17, the eighth transistor T8 and the tenth transistor T10). That is to say, the election circuit transmits the second data signal to the second data write circuits; the second data write circuit writes data into the second drive circuit; the second compensating circuit compensates the second drive circuit; and at this point, the eleventh transistor T11 is switched on, but no electrical current path will be formed.

For instance, in the initialization period t4, the first control end Sn−1 outputs a high level signal; the second control end Sn outputs a high level signal; the third control end Sn+1 outputs a low level signal; the fourth control end En outputs a high level signal; the second data signal end Data2 outputs a second data signal Vdata2 (e.g., a low level signal); and the third data signal end Data3 outputs a high level signal.

Figure 12D:
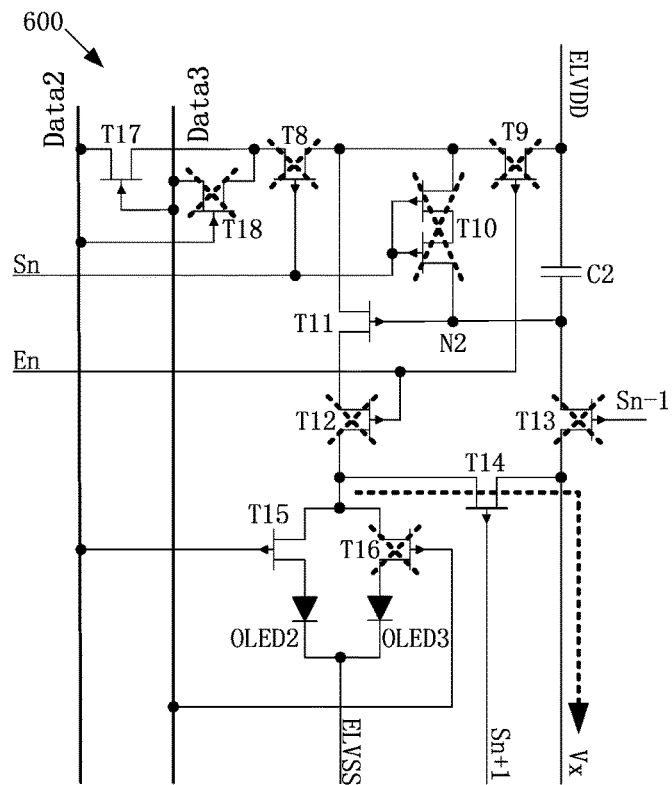
FIG. 12D is a schematic diagram illustrating the conducting state in an initialization period when the pixel circuit as illustrated in FIG. 10 provided by an embodiment of the present disclosure is driven by the drive timing as illustrated in FIG. 11.

FIG. 12D is a schematic diagram illustrating the conducting state when the pixel circuit as illustrated in FIG. 10 provided by an embodiment of the present disclosure is driven by the drive timing as illustrated in FIG. 11. In the initialization period t4, the eighth transistor T8, the ninth transistor T9, the tenth transistor T10, the twelfth transistor T12, the thirteenth transistor T13, the sixteenth transistor T16 and the eighteenth transistor T18 are all in the off-state; due to the storage voltage function of the second storage capacitor C2, the eleventh transistor T11 is kept in the same on-state as that in the compensation period t3; as the second data signal end Data2 outputs the second data signal Vdata2 (e.g., a low level signal), the fifteenth transistor T15 is switched on; as the third data signal Data3 outputs the high level signal, the seventeenth transistor T17 is switched on; as the third control end Sn+1 outputs the low level signal, the fourteenth transistor T14 is switched on; and the reset voltage Vvx provided by the third power end Vx is transmitted to the source electrode of the fifteenth transistor T15 and the source electrode of the sixteenth transistor T16 through the fourteenth transistor T14, namely the second light-emitting circuit is initialized by the second initializing circuit. For instance, the reset voltage Vvx is less than the second luminous voltage Velvss provided by the second power end ELVSS, so the abnormal emission of the OLED can be prevented after initialization, for instance, the slight emission of the OLED in the non-emission period can be avoided. For instance, the OLED is subjected to initializing discharge, so as to ensure the accuracy at a low gray scale and full black under full-dark-state images and effectively improve the contrast of the entire display panel.

For instance, in the pre-emission period t5, the first control end Sn−1 outputs a high level signal; the second control end Sn outputs a high level signal; the third control end Sn+1 outputs a high level signal; the fourth control end En outputs a high level signal; the second data signal end Data2 outputs a second data signal Vdata2; and the third data signal end Data3 outputs a high level signal.

Figure 12E:
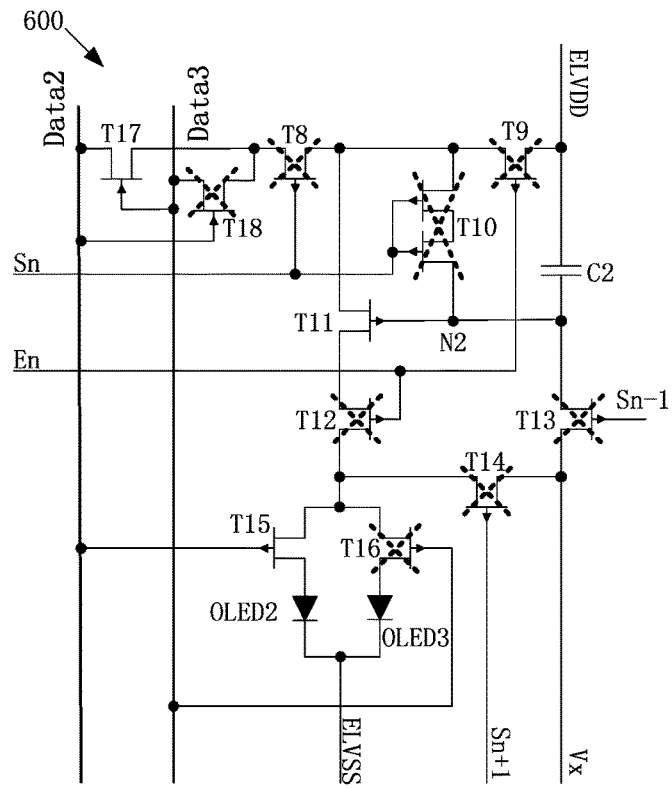
FIG. 12E is a schematic diagram illustrating the conducting state in a pre-emission period when the pixel circuit as illustrated in FIG. 10 provided by an embodiment of the present disclosure is driven by the drive timing as illustrated in FIG. 11.

FIG. 12E is a schematic diagram illustrating the conducting state in the pre-emission period t5 when the pixel circuit as illustrated in FIG. 10 provided by an embodiment of the present disclosure is driven by the drive timing as illustrated in FIG. 11. In the pre-emission period t5, the eighth transistor T8, the ninth transistor T9, the tenth transistor T10, the twelfth transistor T12, the thirteenth transistor T13, the fourteenth transistor T14, the sixteenth transistor T16 and the eighteenth transistor T18 are all in the off-state; the fifteenth transistor T15 and the seventeenth transistor T17 are switched on; and due to the storage voltage function of the second storage capacitor C2, the eleventh transistor T11 is kept in the same on-state as that in the initialization period t4. For instance, the pre-emission period may provide a stable time period for the pixel circuit, obtain stable voltage and current states of circuit elements, and hence avoid circuit abnormalities.

For instance, in the emission period t6, the first control end Sn−1 outputs a high level signal; the second control end Sn outputs a high level signal; the third control end Sn+1 outputs a high level signal; the fourth control end En outputs a low level signal; the second data signal end Data2 outputs a second data signal Vdata2; and the third data signal end Data3 outputs a high level signal.

Figure 12F:
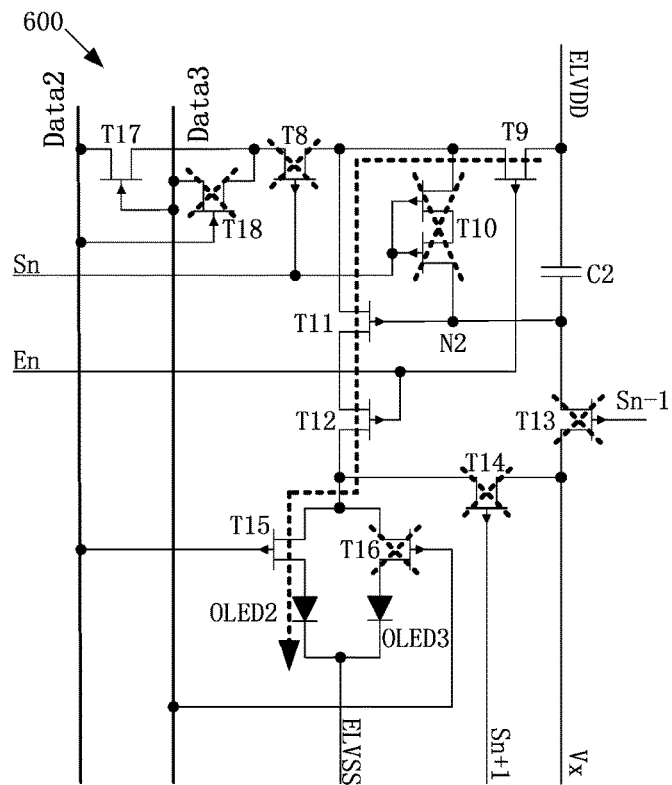
FIG. 12F is a schematic diagram illustrating the conducting state in an emission period when the pixel circuit as illustrated in FIG. 10 provided by an embodiment of the present disclosure is driven by the drive timing as illustrated in FIG. 11.

FIG. 12F is a schematic diagram illustrating the conducting state in the emission period t6 when the pixel circuit as illustrated in FIG. 10 provided by an embodiment of the present disclosure is driven by the drive timing as illustrated in FIG. 11. In the emission period t6, the eighth transistor T8, the tenth transistor T10, the thirteenth transistor T13, the fourteenth transistor T14, the sixteenth transistor 16 and the eighteenth transistor T18 are all in the off-state, and the fifteenth transistor T15 and the seventeenth transistor T17 are switched on; due to the storage voltage function of the storage capacitor C2, the eleventh transistor T11 is kept in the same on-state as that in the pre-emission period t5; as the fourth control end En outputs the low level signal; the ninth transistor T9 and the twelfth transistor T12 are in the on-state; an electrical current path is formed by the first power end ELVDD, the ninth transistor T9, the eleventh transistor T11, the twelfth transistor T12, the fifteenth transistor T15, the second organic light-emitting diode OLED2 and the second power end ELVSS; and the second organic light-emitting diode OLED2 is driven by the eleventh transistor T11 to emit light under the action of the first luminous voltage Velvdd provided by the first power end ELVDD and the second luminous voltage Velvss provided by the second power end ELVSS. That is to say, the second emission control circuit controls the operation of the second light-emitting circuit; the first power end provides the first luminous voltage to the second light-emitting circuit; the second power end provides the second luminous voltage for the second light-emitting circuit; the second drive circuit drives the second light-emitting circuit; and the second light-emitting circuit emits light in the working process.

It should be noted that the driving method of the pixel circuit as illustrated in FIG. 10 may only include the reset period t2, the compensation period t3, the initialization period t4 and the emission period t6 and does not include the pre-reset period t1 and the pre-emission period t5, or includes one of the pre-reset period t1 and the pre-emission period t5. No limitation is given here.

For instance, the case of independent emission of the third organic light-emitting diode OLED3 is similar to the case of independent emission of the second organic light-emitting diode OLED2. No further description will be given here.

An embodiment of the present disclosure further provides a driving method, which comprises the driving method of the pixel circuit as illustrated in FIG. 6 and the driving method of the pixel circuit as illustrated in FIG. 10.

An embodiment of the present disclosure further provides a display panel, which comprises the pixel circuit provided by any foregoing embodiment of the present disclosure.

For instance, the display panel provided by an embodiment of the present disclosure may further comprise the pixel arrangement structure provided by any foregoing embodiment of the present disclosure. The pixel arrangement structure adopts corresponding pixel circuit.

Figure 13:
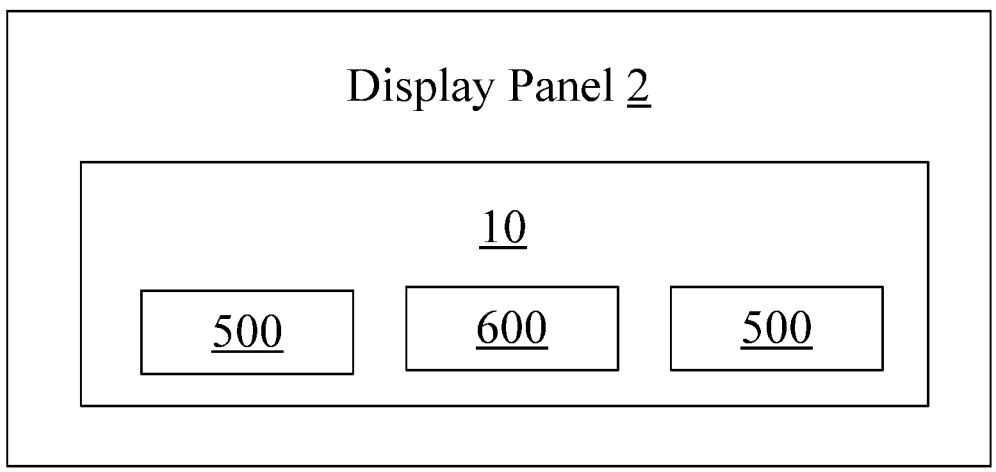
FIG. 13 is a schematic diagram of still another display panel provided by an embodiment of the present disclosure.

For instance, as illustrated in FIG. 13, the display panel 2 comprises the pixel arrangement structure 10 provided by any embodiment of the present disclosure, the pixel circuit 500 and the pixel circuit 600.

For instance, in the display panel 2, a pixel circuit group is formed by two pixel circuits 500 and one pixel circuit 600. In one pixel circuit group, a first OLED of one pixel circuit 500 emits blue light; a first OLED of the other pixel circuit 500 emits yellow light; a second OLED in the pixel circuit 600 emits red light; and a third OLED in the pixel circuit 600 emits green light.

For instance, the OLED in the pixel circuit 500 and the OLED in the pixel circuit 600, in the display panel 2, emit light in the working process of the sub-pixels of the pixel arrangement structure 10.

For instance, the display panel provided by an embodiment of the present disclosure may be applicable to any product or component with display function such as a mobile phone, a tablet PC, a TV, a display, a notebook computer, a digital picture frame and a navigator.

The pixel arrangement structure, the pixel circuit, the display panel and the driving method, provided by the embodiments of the present disclosure, can reduce the distance between the sub-pixels and meanwhile reduce the occupied area of the pixel circuit, and hence improve the resolution of the display panel. Moreover, the embodiment can perform initializing discharge on OLEDs, ensure the accuracy at a low gray scale and full black under full-dark-state images, and effectively improve the contrast of the entire display panel.

Although detailed description has been given above to the present disclosure with general description and preferred embodiments, it shall be apparent to those skilled in the art that some modifications or improvements may be made on the basis of the embodiments of the present disclosure. Therefore, all the modifications or improvements made without departing from the spirit of the present disclosure shall all fall within the scope of protection of the present disclosure.

The application claims priority to the Chinese patent application No. 201610596086.8, filed Jul. 26, 2016, the entire disclosure of which is incorporated herein by reference as part of the present application.

What is claimed is:

1. A pixel arrangement structure comprising:
a first pixel unit including a first sub-pixel, a second sub-pixel, a third sub-pixel and a fourth sub-pixel, wherein a center of the first sub-pixel is coincident with a first vertex of a first virtual diamond;
a center of the second sub-pixel is coincident with a second vertex of the first virtual diamond;
a center of the third sub-pixel is coincident with a third vertex of the first virtual diamond;
a center of the fourth sub-pixel is coincident with a fourth vertex of the first virtual diamond;
the first sub-pixel emits light of a first color in a working process;
the second sub-pixel emits light of a second color in the working process;
the third sub-pixel emits light of a third color in the working process;
the fourth sub-pixel emits light of a fourth color in the working process; and
the first color, the second color, the third color and the fourth color are different from each other,
the pixel arrangement structure, further comprises:
a second pixel unit including a fifth sub-pixel, a sixth sub-pixel, a seventh sub-pixel and an eighth sub-pixel, wherein a center of the fifth sub-pixel is coincident with a first vertex of a second virtual diamond; a center of the sixth sub-pixel is coincident with a second vertex of the second virtual diamond; a center of the seventh sub-pixel is coincident with a third vertex of the second virtual diamond; and a center of the eighth sub-pixel is coincident with a fourth vertex of the second virtual diamond; and
a third pixel unit including a ninth sub-pixel, a tenth sub-pixel, an eleventh sub-pixel and a twelfth sub-pixel, wherein a center of the ninth sub-pixel is coincident with a first vertex of a third virtual diamond; a center of the tenth sub-pixel is coincident with a second vertex of the third virtual diamond; a center of the eleventh sub-pixel is coincident with a third vertex of the third virtual diamond; a center of the twelfth sub-pixel is coincident with a fourth vertex of the third virtual diamond,
wherein a center of the first virtual diamond is coincident with a first vertex of a virtual triangle; a center of the second virtual diamond is coincident with a second vertex of the virtual triangle; and a center of the third virtual diamond is coincident with a third vertex of the virtual triangle.

2. The pixel arrangement structure according to claim 1, wherein the virtual triangle is an acute triangle.

3. The pixel arrangement structure according to claim 1, wherein the first virtual diamond, the second virtual diamond and the third virtual diamond have a same shape.

4. The pixel arrangement structure according to claim 1, wherein the first vertex, the second vertex, the third vertex and the fourth vertex of the first virtual diamond are adjacent to each other in sequence;
the first vertex, the second vertex, the third vertex and the fourth vertex of the second virtual diamond are adjacent to each other in sequence;
the first vertex, the second vertex, the third vertex and the fourth vertex of the third virtual diamond are adjacent to each other in sequence;
the first sub-pixel, the fifth sub-pixel and the ninth sub-pixel have a same shape;
the second sub-pixel, the sixth sub-pixel and the tenth sub-pixel have a same shape;
the third sub-pixel, the seventh sub-pixel and the eleventh sub-pixel have a same shape; and
the fourth sub-pixel, the eighth sub-pixel and the twelfth sub-pixel have a same shape.

5. The pixel arrangement structure according to claim 4, wherein the first sub-pixel, the third sub-pixel, the fifth sub-pixel, the seventh sub-pixel, the ninth sub-pixel and the eleventh sub-pixel are rectangles; and
the second sub-pixel, the fourth sub-pixel, the sixth sub-pixel, the eighth sub-pixel, the tenth sub-pixel and the twelfth sub-pixel are triangles.

6. The pixel arrangement structure according to claim 5, wherein the rectangles are squares; and the triangles are isosceles triangles.

7. The pixel arrangement structure according to claim 5, wherein a perpendicular bisector of one side of the rectangles runs through a center of one virtual diamond; and a perpendicular bisector of one side of the triangles runs through a center of one virtual diamond.

8. The pixel arrangement structure according to claim 4, wherein the first sub-pixel, the fifth sub-pixel and the ninth sub-pixel emit light of the first color in a working process;
the second sub-pixel, the sixth sub-pixel and the tenth sub-pixel emit light of the second color in the working process:
the third sub-pixel, the seventh sub-pixel and the eleventh sub-pixel emit light of the third color in the working process; and
the fourth sub-pixel, the eighth sub-pixel and the twelfth sub-pixel emit light of the fourth color in the working process.

9. The pixel arrangement structure according to claim 8, wherein a mixed color of the second color and the fourth color is the first color or the third color.

10. The pixel arrangement structure according to claim 8, wherein a mixed color of the first color and the third color is white.

11. The pixel arrangement structure according to claim 8, wherein the first color is blue; the second color is green; the third color is yellow; and the fourth color is red.

12. A display panel, comprising the pixel arrangement structure according to claim 1.

13. The pixel arrangement structure according to claim 1, wherein the first vertex, the second vertex, the third vertex and the fourth vertex of the first virtual diamond are adjacent to each other in sequence;
the first sub-pixel and the third sub-pixel are rectangles; and
the second sub-pixel and the fourth sub-pixel are triangles.

14. The pixel arrangement structure according to claim 13, wherein the rectangles are squares; and the triangles are isosceles triangles.

15. The pixel arrangement structure according to claim 13, wherein a perpendicular bisector of one side of the rectangles runs through a center of the first virtual diamond; and
a perpendicular bisector of one side of the triangles runs through the center of the first virtual diamond.

16. The pixel arrangement structure according to claim 1, wherein a mixed color of the second color and the fourth color is the first color or the third color.

17. The pixel arrangement structure according to claim 1, wherein a mixed color of the first color and the third color is white.

18. The pixel arrangement structure according to claim 1, wherein the first color is blue; the second color is green; the third color is yellow; and the fourth color is red.

19. A pixel arrangement structure, comprising:
- a first pixel unit including a first sub-pixel, a second sub-pixel, a third sub-pixel and a fourth sub-pixel, wherein a center of the first sub-pixel is coincident with a first vertex of a first virtual diamond;
- a center of the second sub-pixel is coincident with a second vertex of the first virtual diamond;
- a center of the third sub-pixel is coincident with a third vertex of the first virtual diamond; and
- a center of the fourth sub-pixel is coincident with a fourth vertex of the first virtual diamond;

the pixel arrangement structure further comprises:
- a second pixel unit including a fifth sub-pixel, a sixth sub-pixel, a seventh sub-pixel and an eighth sub-pixel, wherein a center of the fifth sub-pixel is coincident with a first vertex of a second virtual diamond; a center of the sixth sub-pixel is coincident with a second vertex of the second virtual diamond; a center of the seventh sub-pixel is coincident with a third vertex of the second virtual diamond; and a center of the eighth sub-pixel is coincident with a fourth vertex of the second virtual diamond; and
- a third pixel unit including a ninth sub-pixel, a tenth sub-pixel, an eleventh sub-pixel and a twelfth sub-pixel, wherein a center of the ninth sub-pixel is coincident with a first vertex of a third virtual diamond; a center of the tenth sub-pixel is coincident with a second vertex of the third virtual diamond; a center of the eleventh sub-pixel is coincident with a third vertex of the third virtual diamond; a center of the twelfth sub-pixel is coincident with a fourth vertex of the third virtual diamond, wherein a center of the first virtual diamond is coincident with a first vertex of a virtual triangle; a center of the second virtual diamond is coincident with a second vertex of the virtual triangle; and a center of the third virtual diamond is coincident with a third vertex of the virtual triangle.

* * * * *